(12) United States Patent
Oh et al.

(10) Patent No.: US 10,572,406 B2
(45) Date of Patent: Feb. 25, 2020

(54) MEMORY CONTROLLER FOR RECEIVING DIFFERENTIAL DATA STROBE SIGNALS AND APPLICATION PROCESSOR HAVING THE MEMORY CONTROLLER

(71) Applicant: Samsung Electronics Co., Ltd., Suwon-si (KR)

(72) Inventors: Ji-hun Oh, Hwaseong-si (KR); Sang-hune Park, Seongnam-si (KR); Jin-ho Choi, Seoul (KR); Jong-ryun Choi, Hwaseong-si (KR); Dae-ro Kim, Hwaseong-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/433,870

(22) Filed: Feb. 15, 2017

(65) Prior Publication Data

US 2018/0165023 A1    Jun. 14, 2018

(30) Foreign Application Priority Data

Dec. 8, 2016    (KR) ......................... 10-2016-0166887

(51) Int. Cl.
   *G11C 5/14*       (2006.01)
   *G06F 13/16*      (2006.01)
   *G11C 7/10*       (2006.01)

(52) U.S. Cl.
   CPC .......... *G06F 13/1689* (2013.01); *G06F 13/16* (2013.01); *G11C 7/1093* (2013.01)

(58) Field of Classification Search
   CPC ...... G06F 3/0604; G06F 3/064; G06F 3/0656; G06F 3/0673
   See application file for complete search history.

(56) References Cited

U.S. PATENT DOCUMENTS

| | | | |
|---|---|---|---|
| 7,457,175 B1 | 11/2008 | Griffith et al. | |
| 7,733,716 B2 | 6/2010 | Mizutani | |
| 8,477,543 B2 | 7/2013 | Kwon | |
| 8,504,788 B2 * | 8/2013 | Stott | G11C 7/02 365/193 |
| 8,630,131 B1 * | 1/2014 | Shiao | G11C 5/04 326/30 |
| 8,638,622 B2 | 1/2014 | Wang et al. | |
| 9,166,596 B2 | 10/2015 | Chong et al. | |

(Continued)

*Primary Examiner* — Ryan Bertram
*Assistant Examiner* — Trang K Ta
(74) *Attorney, Agent, or Firm* — Muir Patent Law, PLLC

(57) ABSTRACT

A memory controller for receiving a differential data strobe signal and an application processor having the memory controller are disclosed. The memory controller includes a strobe signal receiver configured to receive first and second strobe signals from a memory device as differential data strobe signal and output a first detection signal based on a level of each of the first and second strobe signals, a comparator configured to receive the second strobe signal and a reference voltage and compare a level of the second strobe signal with a level of the reference voltage to output a second detection signal, and a gate signal generator configured to generate a gate signal masking a portion of a period corresponding to the differential data strobe signal using the first detection signal and the second detection signal.

20 Claims, 19 Drawing Sheets

(56) References Cited

U.S. PATENT DOCUMENTS

| | | |
|---|---|---|
| 9,263,108 B2 | 2/2016 | Iijima |
| 2008/0291757 A1* | 11/2008 | Mizutani ............. G06F 13/4221 365/193 |
| 2013/0058175 A1* | 3/2013 | Lin ...................... G11C 7/1045 365/193 |
| 2016/0049183 A1 | 2/2016 | Bose et al. |
| 2016/0133309 A1 | 5/2016 | Maryan et al. |

* cited by examiner

FIG. 2B
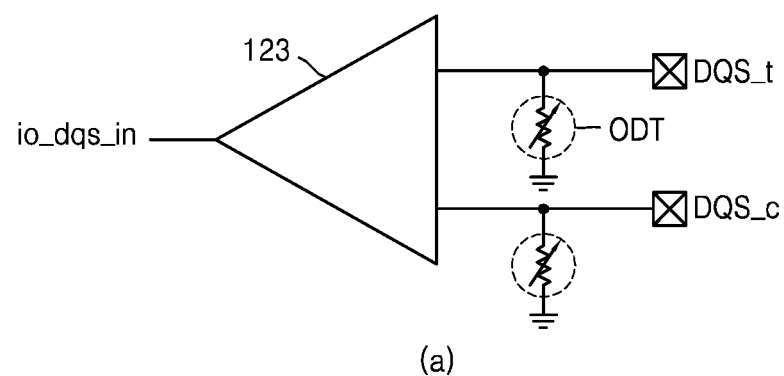
(a)
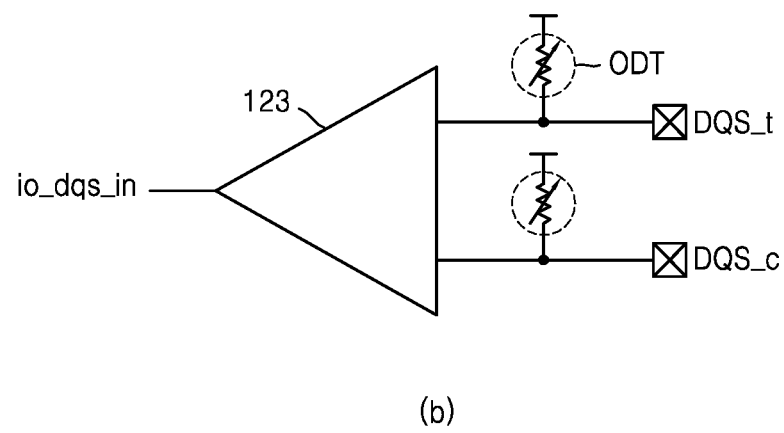
(b)

MEMORY CONTROLLER FOR RECEIVING DIFFERENTIAL DATA STROBE SIGNALS AND APPLICATION PROCESSOR HAVING THE MEMORY CONTROLLER

CROSS-REFERENCE TO RELATED APPLICATION

This application claims the benefit of Korean Patent Application No. 10-2016-0166887, filed on Dec. 8, 2016, in the Korean Intellectual Property Office, the disclosure of which is incorporated herein in its entirety by reference.

BACKGROUND

The present disclosure relates to a memory controller, and more particularly, to a memory controller for receiving differential data strobe signals and an application processor having the memory controller.

A memory controller receives a differential signal used for an internal operation thereof and processes the differential signal. Regarding the type of the differential signal, differential DQS signals are used for a data receiving operation ensure the quality of a high-speed memory operation. The differential DQS signals have a phase difference of about 180 degrees.

However, the differential DQS signals are not synchronized with a clock applied to memory by the memory controller. As an example, a variation in a delay of the differential DQS signals occurs due to variations in voltage and temperature, thereby causing deterioration of the quality of the data receiving operation. In order to prevent this, a DQS cleaning method using a gate training process has been suggested. However, since the DQS cleaning method is required to ensure the accuracy of a high frequency clock up to one clock cycle in a high-speed memory interface, the difficulty of designing a semiconductor device to ensure the accuracy of such a clock increases, and thus, a size of the semiconductor device increases.

SUMMARY

The present disclosure provides a memory controller capable of compensating for a variation in a delay of a differential DQS signal and an application processor having the memory controller.

According to an aspect of the inventive concept, there is provided a memory controller including a strobe signal receiver configured to receive first and second strobe signals from a memory device as a differential data strobe signal and output a first detection signal based on a level of the first and second strobe signals, a comparator configured to receive the second strobe signal and a reference voltage and compare a level of the second strobe signal with a level of the reference voltage to output a second detection signal, and a gate signal generator configured to generate a gate signal masking a portion of a period corresponding to the differential data strobe signal using the first detection signal and the second detection signal. The gate signal generator includes a counter configured to count a toggle of the second detection signal and the gate signal generator is configured to generate the gate signal based on the counting result from the counter.

According to another aspect of the inventive concept, there is provided a memory controller including a strobe signal receiver configured to receive first and second strobe signals as a differential data strobe signal and output a first detection signal based on a level of the first and second strobe signals, an interval detection circuit configured to detect an interval between read commands provided to a memory device and output an interval detection result, and a gate signal generator configured to generate a gate signal masking a portion of a period corresponding to the differential data strobe signal using the first detection signal and the interval detection result.

According to still another aspect of the inventive concept, there is provided a memory device and a memory controller connected to the memory device and configured to generate read commands and write commands, receive data from the memory device, and transmit data to the memory device. One of the memory controller and the memory device comprises a strobe signal receiver configured to output a first detection signal based on first and second strobe signals externally received, a comparator configured to compare one of the first and second strobe signals with a reference voltage and output a second detection signal based on the comparison result, a gate signal generator configured to generate a gate signal to transfer the first detection signal during an active state of the gate signal or to block the first detection signal during an inactive state of the gate signal, based on the first and second detection signals and an interval between consecutively generated read commands or write commands, and a strobe signal generator configured to output a data strobe signal based on the first detection signal and the gate signal. The memory controller is configured to receive/transmit data from/to the memory device in synchronization with the data strobe signal.

BRIEF DESCRIPTION OF THE DRAWINGS

FIGS. 2A and 2B are block diagrams showing a memory controller of FIG. 1 according to example embodiments;

DETAILED DESCRIPTION

Hereinafter, various exemplary embodiments will be explained in detail with reference to the accompanying drawings.

It will be understood that, although the terms first, second, third etc. may be used herein to describe various elements, these elements should not be limited by these terms. Unless indicated otherwise, these terms are generally used to distinguish one element from another. Thus, a first element discussed below in one section of the specification could be termed a second element in a different section of the specification without departing from the teachings of the present disclosure. Also, terms such as "first" and "second" may be used in the claims to name an element of the claim, even thought that particular name is not used to describe in connection with the element in the specification. As used herein, the term "and/or" includes any and all combinations of one or more of the associated listed items. Expressions such as that, although the terms first, second, third etc. may be used herein to describe various elements, these elements should elements of the list.

Expressions such as "at least one of," when preceding a list of elements, modify the entire list of elements and do not modify the individual elements of the list.

Figure 1:
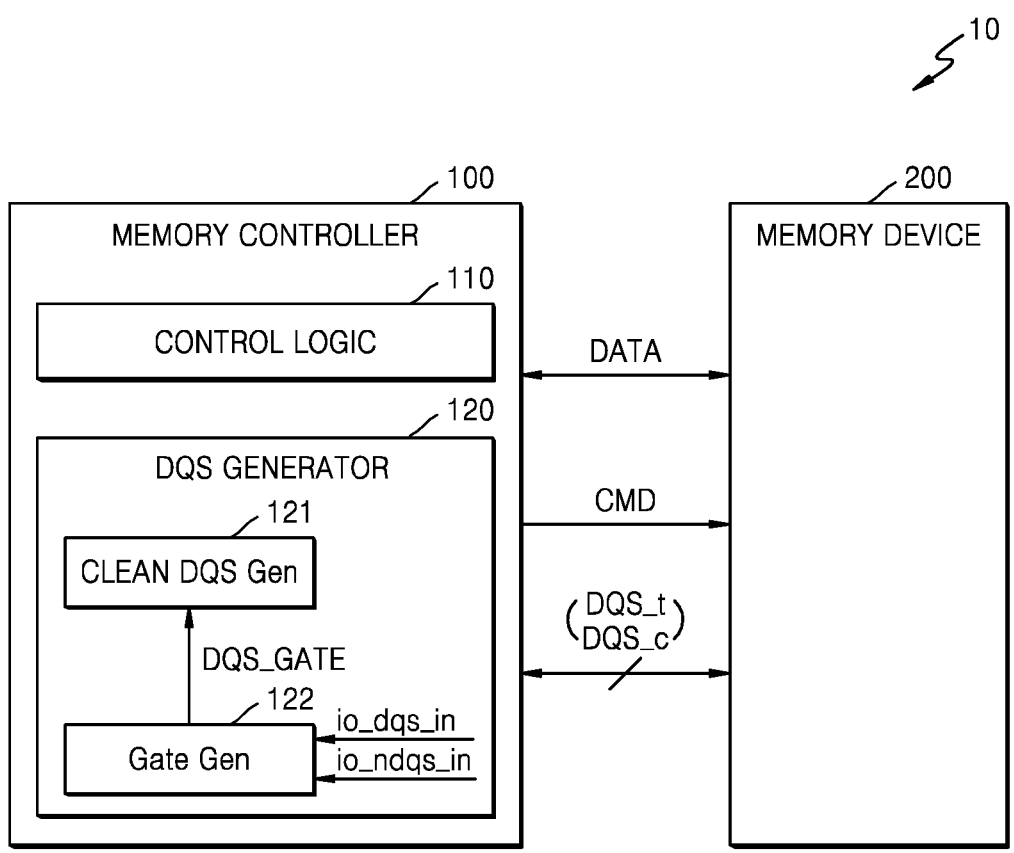
FIG. 1 is a block diagram showing a memory system according to example embodiments.

FIG. 1 is a block diagram showing a memory system according to example embodiments.

A semiconductor device may perform a variety of functions and generate a clock signal using a differential signal provided from an external source when performing internal operations. The functions of the semiconductor device may be performed based on the generated clock signal. According to example embodiments, the semiconductor device may be any device that may control or access a memory device. According to an embodiment, the semiconductor device may be a memory controller or an application processor, and the application processor may be implemented in a System on Chip (SoC). The application processor may include a memory control module to control or access an internal or external memory device.

In addition, according to example embodiments, the semiconductor device may be a memory device including a memory cell array. For instance, the semiconductor device may be a Dynamic Random Access Memory (DRAM), such as a Double Data Rate Synchronous Dynamic Random Access Memory (DDR SDRAM), a Low Power Double Data Rate (LPDDR) SDRAM, a Graphics Double Data Rate (GDDR) SDRAM, a Rambus Dynamic Random Access Memory (RDRAM), etc. According to other example embodiments, the semiconductor device may be a non-volatile memory device, e.g., flash memory.

Further, according to example embodiments, the semiconductor device may be any device having a communication function. According to an embodiment, the semiconductor device may be a modem chip that processes a baseband signal. According to another embodiment, the semiconductor device may be a ModAP configured by integrating a modem function into the application processor.

The semiconductor device, which may be any of the various devices mentioned above, may receive the differential signal from the external source. Hereinafter, the semiconductor device may correspond to the memory controller or the application processor, and the differential signal may correspond to a differential data strobe signal (hereinafter, referred to as a "differential DQS signal"). However, the semiconductor device according to example embodiments may be applied to semiconductor devices processing various differential signals.

FIG. 1 is a block diagram showing a memory controller 100 and a memory system 10 including the memory controller 100 according to example embodiments.

Referring to FIG. 1, the memory system 10 may further include a memory device 200. The memory controller 100 may include a control logic 110 and a memory interface and transmit a variety of signals to the memory device 200 through the memory interface to control a memory operation, e.g., a write operation, a read operation, etc. The memory controller 100 may transmit and receive data DATA to and from the memory device 200. For instance, the memory controller 100 may send a command CMD to the memory device 200 to control the memory operation. The command CMD may include a command for a normal memory operation, e.g., a read or write operation of data DATA. According to an embodiment, the memory interface may include a data strobe signal (DQS) generator 120.

Regarding various clock signals associated with the memory operation, data strobe signals (hereinafter, referred to as "differential DQS signals DQS_t and DQS_c") corresponding to the differential signal may be provided to the memory controller 100 so as to ensure a quality of a clock signal in a high-speed operation. The differential DQS signals DQS_t and DQS_c may include a first DQS signal DQS_t and a second DQS signal DQS_c, and the first DQS signal DQS_t and the second DQS signal DQS_c may be signals having complementary levels with each other or a phase difference of about 180 degrees in a data readout period during which the data DATA are normally received.

In addition, the data DATA may be transmitted along with a single-ended signal. The memory controller 100 latches the data DATA readout from the memory device 200 in synchronization with the differential DQS signals DQS_t and DQS_c to receive the data DATA. In order to maximize a data bandwidth per channel in data transmission and reception, a memory write/read operation may be implemented in a half duplex link. In this case, an idle period may exist between a plurality of commands, e.g., between a present read command and a next read command.

Regarding the memory controller 100, an on-die termination (ODT) circuit may be used for a path through which the differential DQS signals DQS_t and DQS_c are received, and the ODT circuit may be enabled at a point in the idle period to receive the differential DQS signals DQS_t and DQS_c. As an example, the ODT circuit connected to a ground voltage may be applied to the path through which the differential DQS signals DQS_t and DQS_c are received, and in this case, the differential DQS signals DQS_t and DQS_c may lose their differential characteristics since each of the first DQS signal DQS_t and the second DQS signal DQS_c has a logic low level.

In addition, in the operation of the memory system 10, a preamble period corresponding to a predetermined clock period (e.g., two-clock (2*CLK) period) may exist after the idle period is finished and before data are actually received (or before the data readout period starts), and a postamble period corresponding to a predetermined clock period may exist after the data reception is finished. The data that is actually received may be referred to as a valid data. The differential DQS signals DQS_t and DQS_c may have the differential characteristics at a timing at which the preamble period starts, and in this case, the first DQS signal DQS_t and the second DQS signal DQS_c may have different logic low levels from each other. As an example, the differential DQS signals DQS_t and DQS_c may be toggled at least once during the preamble period regardless of the actual reception of the data. As another example, the differential DQS signals DQS_t and DQS_c may not be toggled at least once during the preamble period.

In addition, the memory controller 100 may generate a gate signal DQS_GATE to prevent errors, which may be caused by the toggling of the differential DQS signals DQS_t and DQS_c in an undesired period, from occurring during the reception of the data DATA. The gate signal DQS_GATE may remove the errors during the reception of the data DATA by masking periods other than the period in which the differential DQS signals DQS_t and DQS_c are normally toggled. However, a delay variation may exist in the differential DQS signals DQS_t and DQS_c provided to the memory controller 100 due to various causes, e.g., variations of voltage and temperature in the memory device 200. In this case, a difference may occur between a period in which the gate signal DQS_GATE is activated to release the masking of the gate signal DQS_GATE, and a period in which the data DATA are actually received, and thus, the reception of one or more initial data DATA or the reception of one of more last data DATA may fail.

According to an embodiment, the DQS generator 120 may include a clean DQS signal generator 121 and a gate signal generator 122. The clean DQS signal generator 121 may generate a clean DQS signal CLEAN_DQS, e.g., a latch control signal, to control a latch circuit (or a flip-flop) receiving and storing the data DATA, and as an example, the clean DQS signal generator 121 may generate the clean DQS signal CLEAN_DQS as the latch control signal using the differential DQS signals DQS_t and DQS_c and the gate signal DQS_GATE generated by the gate signal generator 122. For instance, the clean DQS signal CLEAN_DQS may correspond to the signal masking a portion of the differential DQS signals DQS_t and DQS_c in accordance with the gate signal DQS_GATE.

Meanwhile, the gate signal generator 122 may generate the gate signal DQS_GATE to allow the clean DQS signal optimized for receiving the data DATA to be generated and may provide the gate signal DQS_GATE to the clean DQS signal generator 121. According to an embodiment, the gate signal generator 122 may receive one or more detection signals io_dqs_in and io_ndqs_in caused by the differential DQS signals DQS_t and DQS_c, process the detection signals io_dqs_in and io_ndqs_in to generate one or more internal signals (not shown), and process the internal signals to generate the gate signal DQS_GATE. As an example, a first detection signal io_dqs_in may correspond to a signal obtained by comparing (or detecting) levels of the differential DQS signals DQS_t and DQS_c, and a second detection signal io_ndqs_in may correspond to a signal obtained by comparing (or detecting) a level of one of the differential DQS signals DQS_t and DQS_c with a level of a predetermined reference voltage (not shown).

According to the above-mentioned operation, the gate signal generator 122 may generate the gate signal DQS_GATE based on the comparison result of levels of the differential DQS signals DQS_t and DQS_c and the comparison result of the level of one of the differential DQS signals DQS_t and DQS_c with the level of the predetermined reference voltage (not shown). Accordingly, although the delay variation exists in the differential DQS signals DQS_t and DQS_c provided from the memory device 200, the gate signal DQS_GATE reflecting the delay variation may be generated. Thus, the period in which the gate signal DQS_GATE is activated may be optimized with regard to the period in which the data DATA are actually received, and a reception quality of the data DATA latched by the clean DQS signal may be improved.

FIG. 1 shows that the memory controller 100 includes the DQS generator 120, but the inventive concept should not be limited thereto. According to an embodiment, the differential DQS signals DQS_t and DQS_c may be bidirectionally transmitted between the memory controller 100 and the memory device 200, and the differential DQS signals DQS_t and DQS_c may be provided to the memory device 200 from the memory controller 100 during the data write operation. In this case, a data strobe signal (DQS) receiver that performs the same or similar operation as in the above-described embodiments may be included in an interface circuit of the memory device 200.

Figure 2A:
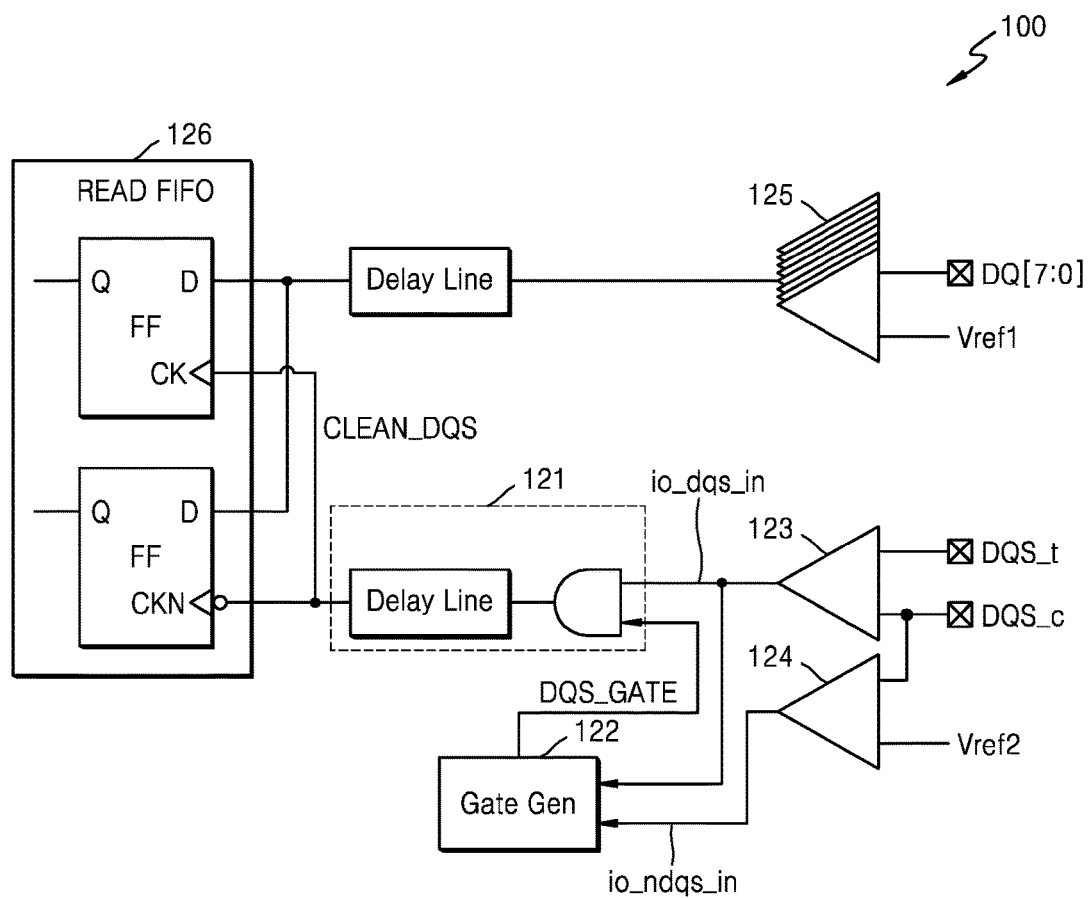

FIGS. 2A and 2B are block diagrams showing the memory controller 100 of FIG. 1 according to example embodiments.

Referring to FIGS. 2A and 2B, the memory controller 100 may include the clean DQS signal generator 121 and the gate signal generator 122, and the memory controller 100 may include various components associated with the reception of the data DATA and the differential DQS signals DQS_t and DQS_c. As an example, the memory controller 100 may include one or more data receivers 125 receiving the data DATA through one or more DQ pads (or DQ pins). The memory controller 100 may further include a DQS receiver 123 receiving the differential DQS signals DQS_t and DQS_c. The receivers 123 and 125 may be any of various types of logical circuits, e.g., a buffer, a comparator, etc. According to an embodiment, each of the receivers 123 and 125 may be implemented in a comparator that compares levels of signals applied to input terminals thereof and outputs an output signal.

In one embodiment, each of the data receivers 125 may include first and second input terminals receiving data and a reference voltage Vref1 respectively. As an example, the reference voltage Vref1 may have a level corresponding to an intermediate level between the logic low level and the logic high level.

In one embodiment, each of the one or more data receivers 125 may be implemented in a buffer. In this case, the buffer may not be connected to the reference voltage Vref1.

The memory controller 100 may further include a comparator 124 comparing one of the differential DQS signals DQS_t and DQS_c with a reference voltage Vref2. As an example, the comparator 124 may compare a level of the second DQS signal DQS_c with a level of the reference voltage Vref2 to output the comparison result. As an example, the reference voltage Vref2 may have a level corresponding to an intermediate level between the logic low level and the logic high level. The level of the reference voltage Vref2 of the comparator 124 may be the same as or different from the level of the data receivers 125. The DQS receiver 123 may compare the levels of the differential DQS signals DQS_t and DQS_c to output the first detection signal io_dqs_in, and the comparator 124 may compare a level of the second DQS signal DQS_c with the level of the reference voltage Vref2 to output the second detection signal io_ndqs_in. As an example, the reference voltage Vref2 may have a level corresponding to an intermediate level between the logic low level and the logic high level.

The memory controller 100 may further include one or more latch circuits (e.g., flip-flops) 126 latching the readout data DATA provided thereto. For convenience to describe, only one latch circuit 126 is described. For example, each of the one or more data receivers 125 may be connected to a corresponding latch circuit 126 through each delay line DL1. For instance, the clean DQS signal CLEAN_DQS provided from the clean DQS signal generator 121 may be provided to a clock terminal CK and CKN of the latch circuit 126, and the latch circuit 126 may latch the readout data DATA in response to the clean DQS signal CLEAN_DQS. For example, the clean DQS signal generator 121 may include a delay line DL2 connected to the latch circuit 126.

According to an embodiment, an operation of the memory controller 100 shown in FIGS. 1, 2A, and 2B is as follow.

The clean DQS signal generator 121 may generate the clean DQS signal CLEAN_DQS used to latch the data DATA by using the first detection signal io_dqs-in and the gate signal DQS_GATE. For instance, the clean DQS signal CLEAN_DQS may be generated since the portion of the period of the first detection signal io_dqs_in is masked by the gate signal DQS_GATE. In FIG. 2A, the clean DQS signal generator 121 includes an AND logic circuit performing an AND operation on the first detection signal io_dqs_in and the gate signal DQS_GATE, however, the memory controller 100 may be implemented to allow the clean DQS signal CLEAN_DQS to be generated by various types of logic circuits.

The gate signal generator 122 may generate the gate signal DQS_GATE based on a combination of the first detection signal io_dqs_in and the second detection signal io_ndqs_in. The first detection signal io_dqs_in and the second detection signal io_ndqs_in correspond to signals caused by the differential DQS signals DQS_t and DQS_c, and thus the delay variation may be reflected (or compensated) in the first and second detection signals io_dqs_in and io_ndqs_in even though the delay variation occurs in the differential DQS signals DQS_t and DQS_c.

As an example, the differential DQS signals DQS_t and DQS_c may lose the differential characteristics since the first DQS signal DQS_t and the second DQS signal DQS_c have the same logic level, e.g., the logic low level, in the idle period, and thus the first detection signal io_dqs_in output from the DQS receiver 123 has a tri-state or an unknown state. On the contrary, during the idle period, the comparator 124 may output the second detection signal io_ndqs_in having the logic low level based on the compared result of the second DQS signal DQS_c having the logic low level and the reference voltage Vref2.

When the preamble period starts, each of the first DQS signal DQS_t and the second DQS signal DQS_c may have a specific level and may be applied to the memory controller 100. As an example, the first DQS signal DQS_t may be maintained at the logic low level at a start timing (a first timing) of the preamble period, and the second DQS signal DQS_c may be maintained at the logic high level at the first timing of the preamble period. Since the second DQS signal DQS_c is transitioned to the logic high level from the logic low level at the first timing, the second detection signal io_ndqs_in output from the comparator 124 may transition to the logic high level, and thus a first internal signal (not shown) activated at the first timing (or a timing of a rising edge of the second detection signal io_ndqs_in) may be generated. In addition, since the memory controller 100 receives the data DATA corresponding to a predetermined burst length BL from the memory device 200, an active period of the first internal signal may be adjusted based on the burst length BL.

Meanwhile, the differential DQS signals DQS_t and DQS_c may be toggled at least once in the preamble period.

The first detection signal io_dqs_in output from the DQS receiver 123 may be toggled due to the toggling of the differential DQS signals DQS_t and DQS_c, and as an example, a second internal signal (not shown) activated at a timing (a second timing) of a falling edge of the first detection signal io_dqs_in may be generated. The second internal signal may include an active period corresponding to the burst length BL.

The gate signal generator 122 may generate the gate signal DQS_GATE based on the first and second detection signals io_dqs_in and io_ndqs_in having the above-mentioned waveform. As an example, the gate signal generator 122 may generate the gate signal DQS_GATE using at least the first and second internal signals. That is, although the delay variation exists in the differential DQS signals DQS_t and DQS_c, the gate signal DQS_GATE may be generated based on the variation in level of the differential DQS signals DQS_t and DQS_c during the preamble period. Accordingly, the gate signal DQS_GATE optimized to the reception timing of the data DATA may be generated, and the optimized clean DQS signal CLEAN_DQS may be generated.

FIG. 2B shows the ODT circuit applied to the DQS receiver 123. Referring to FIG. 2B, the on-die termination (ODT) circuit may be applied to an input terminal of the DQS receiver 123 so as to compensate for a deterioration of a signal quality, which is caused by an impedance-matching problem. For example, the ODT circuit may include a resistor and a switch (not shown) connected to each other. As an example, the on-die termination (ODT) resistor may be arranged between each of the input terminals of the DQS receiver 123 and a ground voltage as shown in FIG. 2B(a). As another example, the on-die termination (ODT) resistor may be arranged between each of the input terminals of the DQS receiver 123 and a power source voltage (e.g., VDDQ) as shown in FIG. 2B(b). The termination structure shown in FIG. 2B(b) may be referred to a pseudo-open drain (POD) termination, and a swing width of a signal in the POD termination structure is reduced to a half swing width rather than a general full swing width (0~VDDQ swing width).

In a case where the on-die termination ODT circuit is enabled (i.e., switch is turned on), the differential DQS signals DQS_t and DQS_c may lose the differential characteristics and have an in-phase relation in the idle period described earlier. That is, the differential DQS signals DQS_t and DQS_c having the logic high level or the logic low level may be input to the input terminals of the DQS receiver 123, and FIG. 2A shows the differential DQS signals DQS_t and DQS_c having the logic low level since the ODT circuit connected to the ground voltage is applied.

According to the above-described embodiments, since a separate training process required to clean the gate signal DQS_GATE is not necessary, a resource consumption on the cleaning training may be reduced. In addition, a separate circuit for the cleaning training is not necessary, and thus a size of a chip required to implement the memory controller 100 or the application processor having the memory controller 100 may be reduced.

Figure 3:
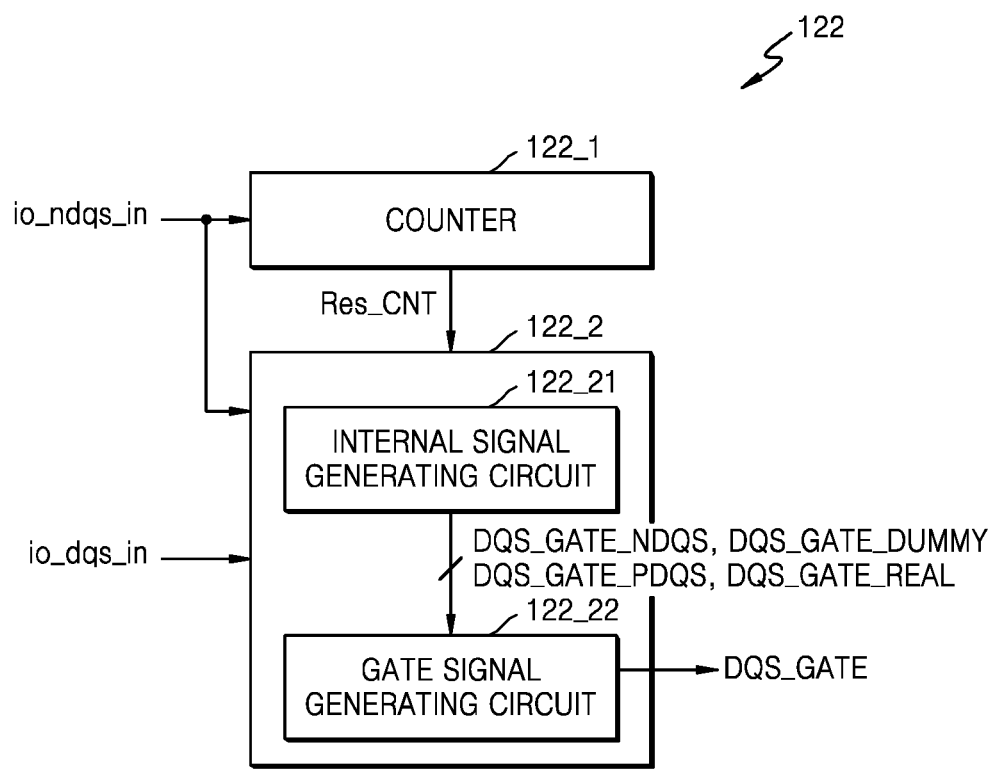
FIG. 3 is a block diagram showing a gate signal generator according to example embodiments.

FIG. 3 is a block diagram showing the gate signal generator 122 of FIG. 2 according to example embodiments.

Referring to FIG. 3, the gate signal generator 122 may include a counter 122_1 and a signal processing circuit 122_2. In addition, the signal processing circuit 122_2 may include an internal signal generating circuit 122_21 generating one or more internal signals and a gate signal generating circuit 122_22 generating the gate signal DQS_GATE. The counter 122_1 may perform a counting operation using one detection signal, e.g., the second detection signal io_n- dqs_in, and provide the counted result Res_CNT to the signal processing circuit 122_2. The signal processing circuit 122_2 may generate the gate signal DQS_GATE using the first and second detection signals io_dqs_in and io_ndqs_in and the counted result Res_CNT.

As an example, the internal signal generating circuit 122_21 may generate various internal signals DQS_GATE_NDQS, DQS_GATE_PDQS, DQS_GATE_DUMMY, and DQS_GATE_REAL using the first and second detection signals io_dqs_in and io_ndqs_in and the counted result Res_CNT. The gate signal generating circuit 122_22 may generate the gate signal DQS_GATE using at least one of internal signals DQS_GATE_NDQS, DQS_GATE_PDQS, DQS_GATE_DUMMY, and DQS_GATE_REAL.

Figure 4:
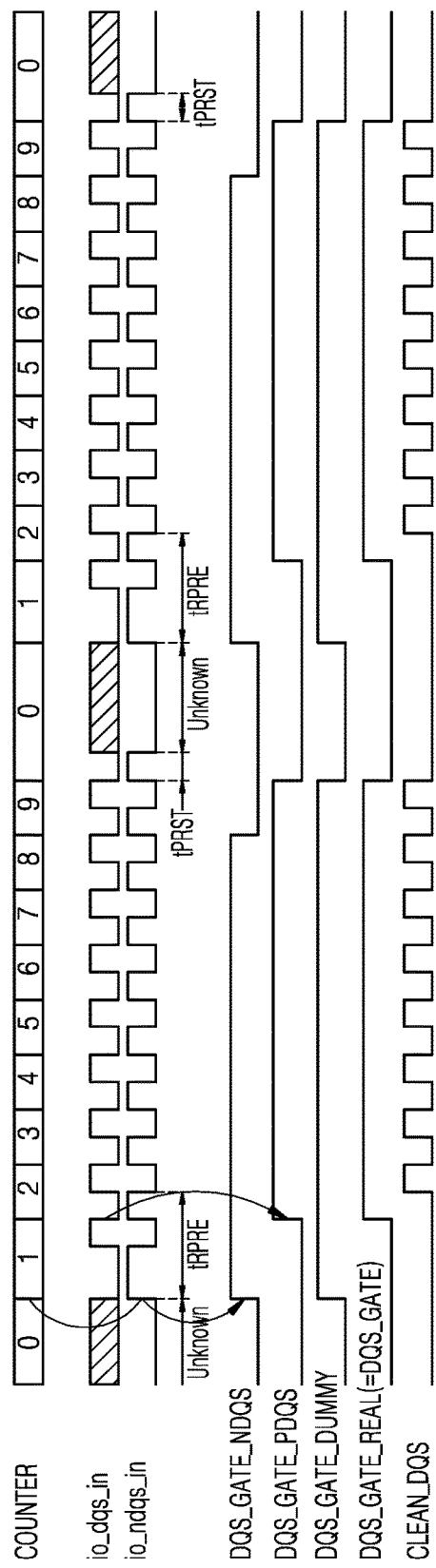
FIG. 4 is a waveform diagram showing an operation of a memory controller according to example embodiments.

The various signals shown in FIG. 3 will be described in detail with reference to FIG. 4. FIG. 4 is a waveform diagram showing an operation of the memory controller according to example embodiments.

FIG. 4 shows the first detection signal io_dqs_in having the unknown state and the second detection signal io_ndqs_in having the logic low level in a case where the ODT circuit connected to the DQS receiver (e.g., the ODT circuit connected to the ground voltage) is enabled in the idle period. In addition, the preamble period tRPRE exists before the data readout period, the differential DQS signals DQS_t and DQS_c are effectively toggled in accordance with the burst length BL in the data readout period, and the postamble period tPRST exists after the data readout period. In a case where a plurality of read commands are consecutively generated, the idle period, the preamble period, the data readout period, and the postamble period may be repeated after the postamble period tPRST. In addition, the burst length BL in FIG. 4 corresponds to 16.

Referring to FIGS. 3 and 4, the counter 122_1 may count a rising edge of the second detection signal io_ndqs_in, and when the preamble period tRPRE corresponding to two clock (2 CLK) periods starts, the second detection signal io_ndqs_in is transitioned to the logic high level and the counter 122_1 counts 1. Then, the first internal signal DQS_GATE_NDQS may be activated at the start timing of the preamble period tRPRE (or a timing at which the logic level of the second detection signal io_ndqs_in is changed). In addition, the active period of the first internal signal DQS_GATE_NDQS may be adjusted based on the burst length BL. As an example, when the counted value of the counter 122_1 is 9 in accordance with the toggling of the second detection signal io_ndqs_in, the first internal signal DQS_GATE_NDQS may be inactivated.

Meanwhile, although an activation time point and an inactivation time point of the second internal signal DQS_GATE_PDQS may be different from those of the first internal signal DQS_GATE_NDQS, the second internal signal DQS_GATE_PDQS may have a waveform corresponding to that of the first internal signal DQS_GATE_NDQS. The second internal signal DQS_GATE_PDQS may be generated by capturing the first internal signal DQS_GATE_NDQS in response to the first detection signal io_dqs_in. As an example, the second internal signal DQS_GATE_PDQS may be activated at a falling edge of the first detection signal io_dqs_in in the preamble period tRPRE.

Meanwhile, a third internal signal DQS_GATE_DUMMY may be generated using the first internal signal DQS_GATE_NDQS and the second internal signal DQS_GATE_PDQS. In detail, the third internal signal DQS_GATE_DUMMY may be generated by performing an OR operation on the first internal signal DQS_GATE_NDQS and the second internal signal DQS_GATE_PDQS. Meanwhile, a fourth internal signal DQS_GATE_REAL may be generated using at least one of the first, second, and third internal signals DQS_GATE_NDQS, DQS_GATE_PDQS, and DQS_GATE_DUMMY and one or more internal signals not shown in FIG. 4. In the embodiment shown in FIG. 4, the fourth internal signal DQS_GATE_REAL may have the same waveform as that of the second internal signal DQS_GATE_PDQS.

The gate signal DQS_GATE may be generated using the various internal signals DQS_GATE_NDQS, DQS_GATE_PDQS, DQS_GATE_DUMMY, and DQS_GATE_REAL. As an example, in a case where the preamble period tRPRE in which the differential DQS signals DQS_t and DQS_c are toggled at least once is defined between the memory controller 100 and the memory device 200 regardless of the reception of the data, the fourth internal signal DQS_GATE_REAL may be generated as the gate signal DQS_GATE. On the contrary, in a case where the preamble period tRPRE is not defined between the memory controller and the memory device, the gate signal DQS_GATE may be generated by another processing method using the various internal signals DQS_GATE_NDQS, DQS_GATE_PDQS, DQS_GATE_DUMMY, and DQS_GATE_REAL.

Meanwhile, since the memory controller consecutively outputs the read commands, several data readout periods may exist as shown in FIG. 4, and the waveforms of the internal signals DQS_GATE_NDQS, DQS_GATE_PDQS, DQS_GATE_DUMMY, and DQS_GATE_REAL may be changed to receive the readout data according to a next read command. As an example, the gate signal DQS_GATE may have an inactive period to mask the idle period and the preamble period before a next data readout period and may be activated during the next data readout period. In addition, the various internal signals DQS_GATE_NDQS, DQS_GATE_PDQS, DQS_GATE_DUMMY, and DQS_GATE_REAL and the gate signal DQS_GATE, which are generated according to example embodiments, may be generated by a variety of signal processing methods within a range having the same or similar waveform other than the above-mentioned method.

According to the above-described embodiments, although the delay variation exists in the differential DQS signals DQS_t and DQS_c, the active period of the gate signal DQS_GATE is adjusted based on the first and second detection signals io_dqs_in and io_ndqs_in generated using the differential DQS signals DQS_t and DQS_c and the reference voltage Vref2. Accordingly, the reception quality of the data DATA may be improved.

Figure 5:
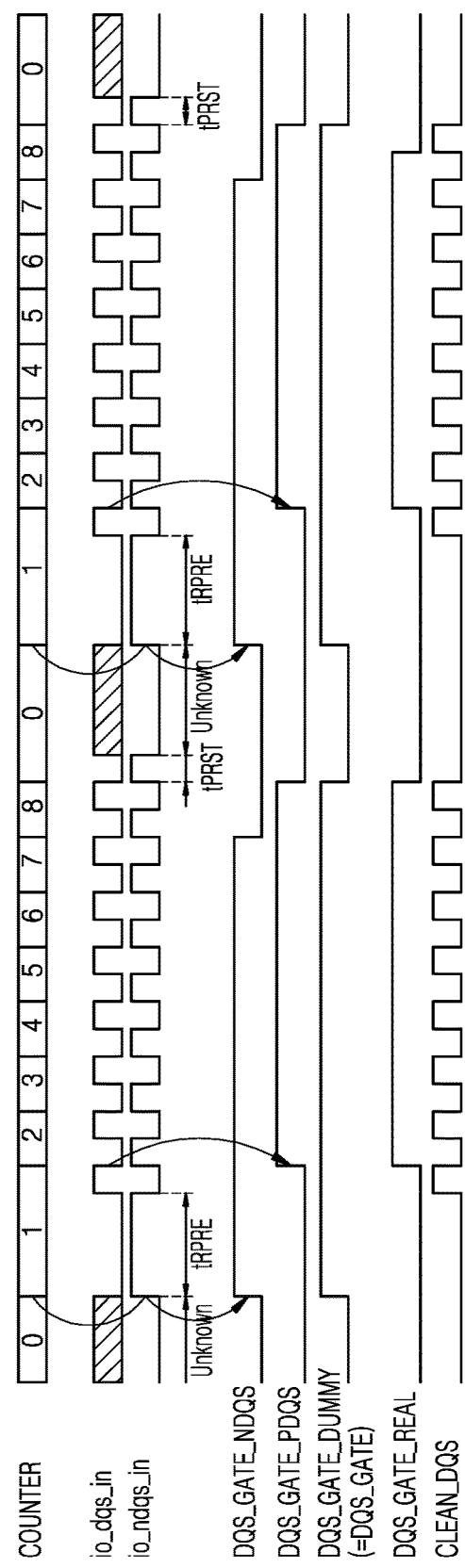
FIG. 5 is a waveform diagram showing an operation of a memory controller according to other example embodiments.

FIG. 5 is a waveform diagram showing an operation of a memory controller according to other example embodiments.

In detail, FIG. 5 is a waveform diagram showing an operation in a case where a toggle is not defined during a preamble period tRPRE between the memory controller 100 and the memory device 200. In the description on the operation shown in FIG. 5, detailed descriptions of the same or similar operation as those of the above-described embodiments will be omitted.

Referring to FIG. 5, the first internal signal DQS_GATE_NDQS may be activated in response to the second detection signal io_ndqs_in, and the second internal signal DQS_GATE_PDQS may be activated in response to the first detection signal io_dqs_in. In addition, the third internal signal DQS_GATE_DUMMY may be generated by performing an OR operation on the first internal signal DQS_GATE_NDQS and the second internal signal DQS_GATE_PDQS. The fourth internal signal DQS_GATE_REAL may have the same waveform as that of the second internal signal DQS_GATE_PDQS in the embodiment shown in FIG. 5.

In the present embodiment, effective differential DQS signals DQS_t and DQS_c may be directly provided to the memory controller without generating a separate toggle during the preamble period tRPRE. Accordingly, the data DATA may be effectively received during the period in which the counter 122_1 counts the value of 1, and the first internal signal DQS_GATE_NDQS may be inactivated when the counted value of the counter 122_1 corresponds to 8. In addition, in the case where the toggle of the differential DQS signals is not defined during the preamble period tRPRE, different from the above-described embodiments, the third internal signal DQS_GATE_DUMMY may be generated as the gate signal DQS_GATE.

FIG. 5 shows the operation in the case where the toggle is not defined during the preamble period tRPRE, however, the memory controller may be operated in response to the same or similar waveform as those of the described embodiments shown in FIG. 5 in the case where the preamble period tRPRE does not exist during the data readout operation.

Figure 6:
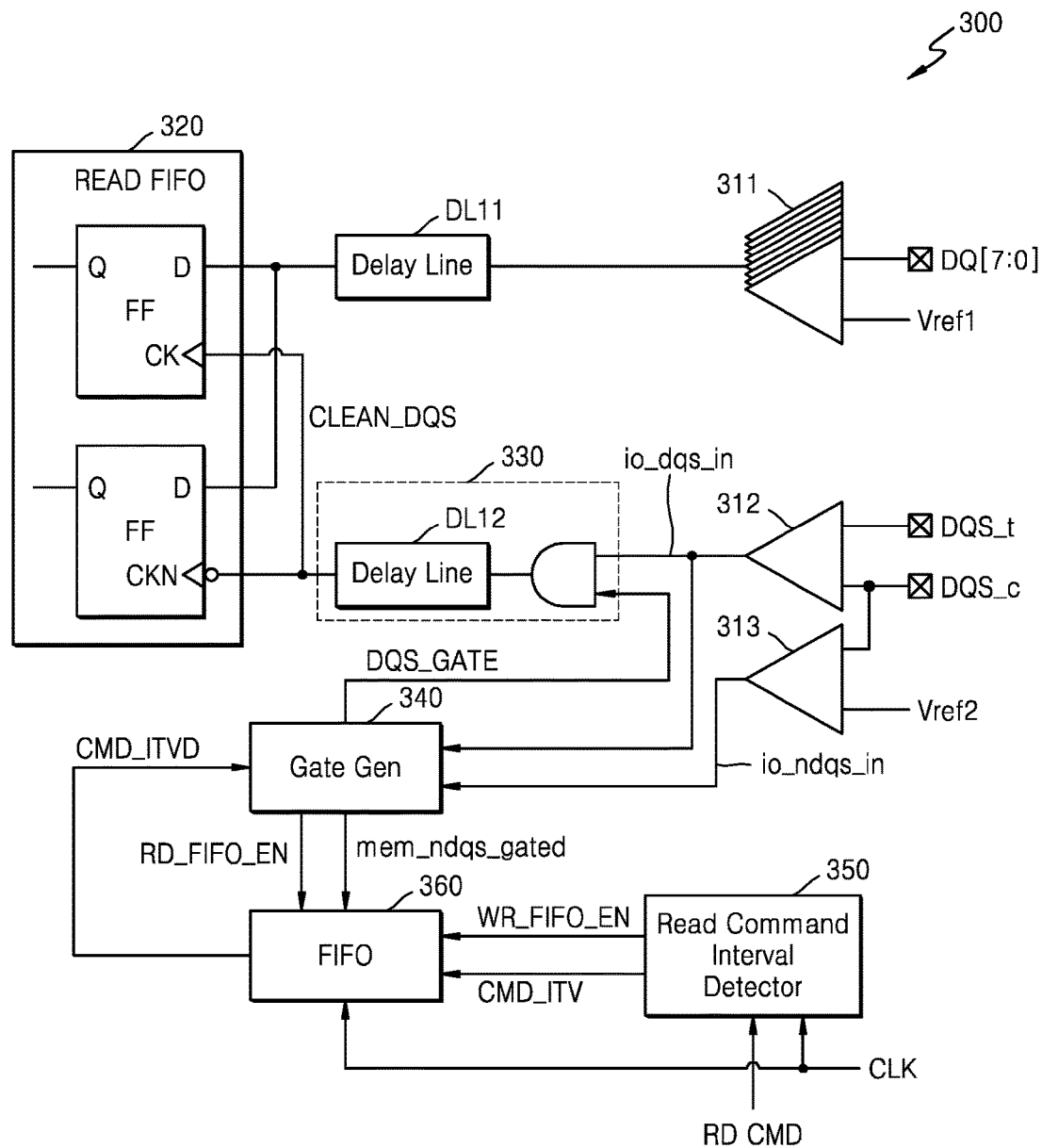
FIG. 6 is a block diagram showing a memory controller according to other example embodiments.

FIG. 6 is a block diagram showing a memory controller 300 according to other example embodiments. Among elements shown in FIG. 6, the same elements as those of FIG. 2A perform the same or similar operation, and thus detailed descriptions of the same elements will be omitted.

Referring to FIG. 6, the memory controller 300 may include one or more data receivers 311 receiving data DATA, a DQS receiver 312 receiving differential DQS signals DQS_t and DQS_c, and a comparator 313 comparing one of the differential DQS signals DQS_t and DQS_c with a reference voltage Vref. Each of the receivers 311 and 312 and the comparator 313 receives two input signals and generates an output based on a difference in level between the two input signals, and thus each of the receivers 311 and 312 and the comparator 313 may be referred to as a differential receiver.

In addition, the memory controller 300 may further include a clean DQS signal generator 330, a gate signal generator 340, and one or more latch circuits (e.g., flip-flops) 320 latching readout data DATA. For convenience to describe, only one latch circuit 320 is shown. In addition, the memory controller 300 may further include a read command interval detector (or, an interval detection circuit) 350 and a register (e.g., an FIFO) 360 storing an interval detection result. According to an embodiment, the read command interval detector 350 and the FIFO 360 may utilize a system clock CLK as their operation clock. In addition, the DQS receiver 312 may output a first detection signal io_dqs_in, the comparator 313 may output a second detection signal io_ndqs_in, the gate signal generator 340 may generate a gate signal DQS_GATE, and the clean DQS signal generator 330 may generate a clean DQS signal CLEAN_DQS. For example, the latch circuit 320 may latch the readout data DATA in synchronization with the clean DQS signal CLEAN_DQS.

The memory controller 300 may provide one or more read commands RD CMD to a memory device (not shown), and the read commands RD CMD may be provided to the read command interval detector 350 to detect an interval between the consecutive read commands.

The interval between the consecutive read commands RD CMD may have various values. As an example, the interval between a time point where the memory controller 300 outputs the read command RD CMD and a time point where the memory controller 300 outputs a next read command RD CMD is defined as a minimum time tCCDmin, and the minimum time tCCDmin may correspond to 8 CLK of the system clock of the memory device (or, the minimum time tCCDmin may correspond to 4 CLK of the system clock of the memory controller in a case where a frequency ratio between the system clock CLK of the memory controller and the system clock of the memory device is 1:2). The memory controller 300 may output the read command RD CMD at the interval equal to or greater than the minimum time tCCDmin, and the read command interval detector 350 may generate the interval detection result CMD_ITV and provide the interval detection result CMD_ITV to the FIFO 360. According to an embodiment, the read command interval detector 350 may further generate a write enable signal WR_FIFO_EN, and the FIFO 360 may store the interval detection result CMD_ITV in synchronization with the write enable signal WR_FIFO_EN.

Meanwhile, the gate signal generator 340 may generate the gate signal DQS_GATE based on the first and second detection signals io_dqs_in and io_ndqs_in. According to an embodiment, the gate signal generator 340 may generate the gate signal DQS_GATE further using the interval detection result. As an example, the gate signal generator 340 may generate a readout enable signal RD_FIFO_EN and provide the readout enable signal RD_FIFO_EN to the FIFO 360, and the gate signal generator 340 may receive a delayed interval detection result CMD_ITV D in response to the readout enable signal RD_FIFO_EN. According to an embodiment, the gate signal generator 340 may further generate a control signal mem_ndqs_gated obtained by removing a glitch from the second detection signal io_ndqs_in and provide the control signal mem_ndqs_gated to the FIFO 360. In a case where information are stored in the FIFO 360, the system clock CLK may be used as the operation clock, and in a case where information are readout from the FIFO 360, the control signal mem_ndqs_gated may be used as the operation clock.

Figure 7:
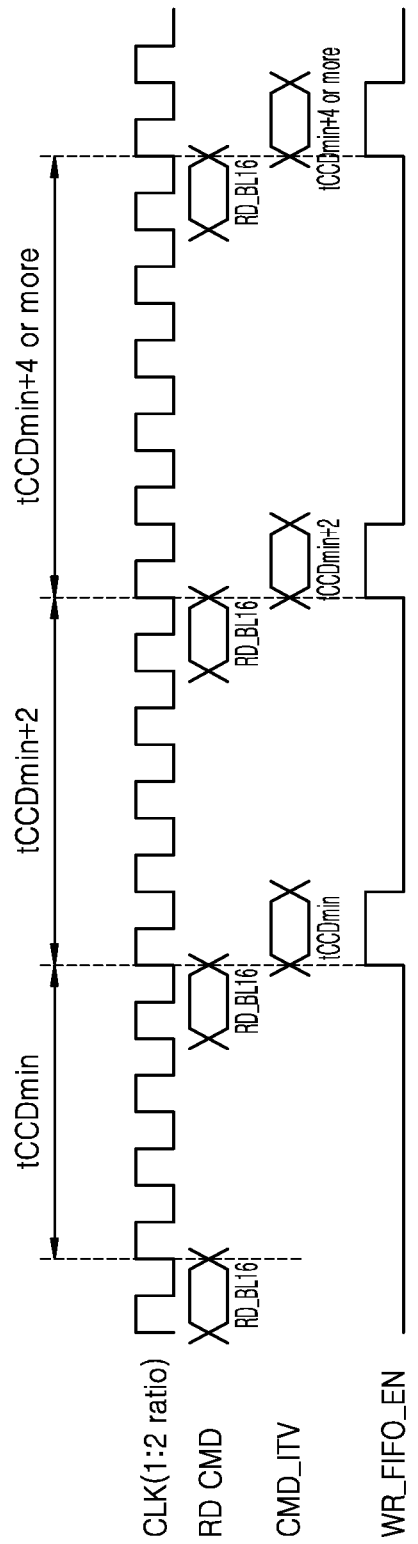
FIGS. 7 and 8 are waveform diagrams showing an example of storing an interval detection result according to example embodiments.
Figure 8:
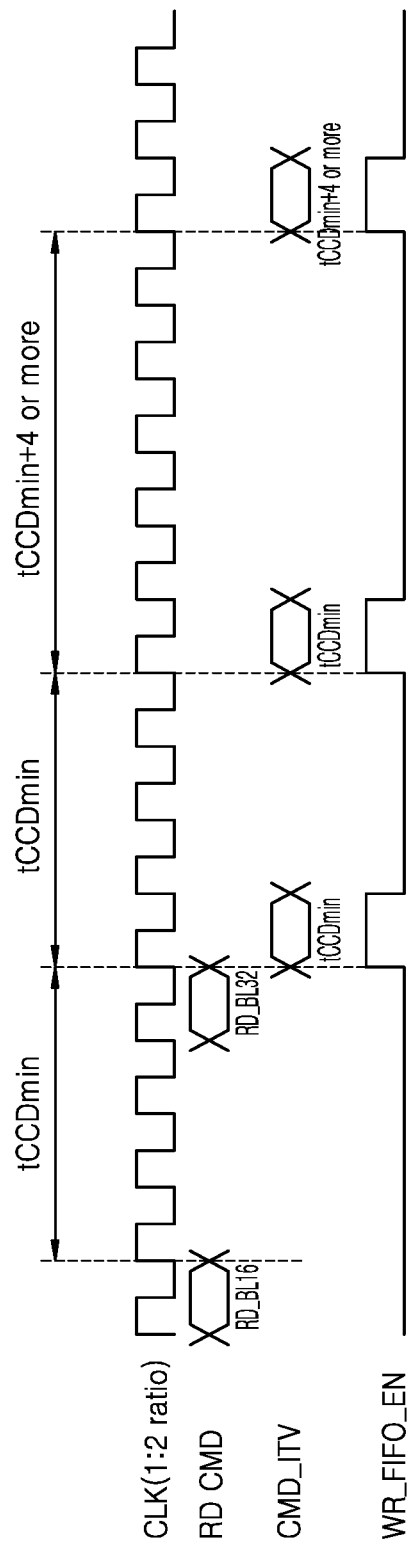

FIGS. 7 and 8 are waveform diagrams showing an example of storing an interval detection result CMD_ITV according to example embodiments. FIGS. 7 and 8 show the waveforms in a case where the frequency ratio between the system clock CLK of the memory controller and the system clock of the memory device is 1:2. In addition, FIG. 7 shows the waveforms in a case where a burst length RD_BL of the read command RD CMD corresponds to 16, and FIG. 8 shows the waveforms in a case where the burst length RD_BL of the read command RD CMD corresponds to 16 or 32.

Referring to FIGS. 6 and 7, the read command interval detector 350 may count a period corresponding to the interval of the consecutive read commands RD CMD and generate the interval detection result CMD_ITV based on the counted result. The interval detection result CMD_ITV corresponding to the minimum time tCCDmin or corresponding to a time (e.g., tCCDmin+2, tCCDmin+4, etc.) longer than the minimum time tCCDmin may be generated depending on the interval of the consecutive read commands RD CMD. The write enable signal WR_FIFO_EN may be generated to be synchronized with the timing at which the interval detection result CMD_ITV is generated, and the interval detection result CMD_ITV of the consecutive read commands RD CMD may be stored in the FIFO 360.

Referring to FIGS. 6 and 8, in a case where the burst length RD_BL corresponds to 32, the interval detection result CMD_ITV may be converted based on the case where the burst length RD_BL is 16. As an example, one read command RD CMD having the burst length RD_BL of 32 may be converted to two 16 BL read commands RD CMD. In this case, since 32-bit data are consecutively output based on the read command RD CMD having the burst length RD_BL corresponding to 32, the 32 BL read command RD CMD may be converted to one 16 BL read command RD CMD generated based on the interval corresponding to the minimum time tCCDmin and one 16 BL read command RD CMD generated based on the interval equal to or greater than the minimum time tCCDmin. FIG. 8 shows an example in which the interval detection result CMD_ITV corresponding to the minimum time tCCDmin and the interval detection result CMD_ITV corresponding to the interval of "tCCDmin+4" or more are stored in the FIFO 360, with respect to the 32 BL read command RD CMD.

Hereinafter, the operation of the memory controller shown in FIGS. 6 to 8 will be described in detail with reference to FIGS. 9 to 11. Among signals shown in waveform diagrams, the same signals as those of FIG. 4 have the same or similar waveform, and thus detailed descriptions thereof will be omitted.

Figure 9:
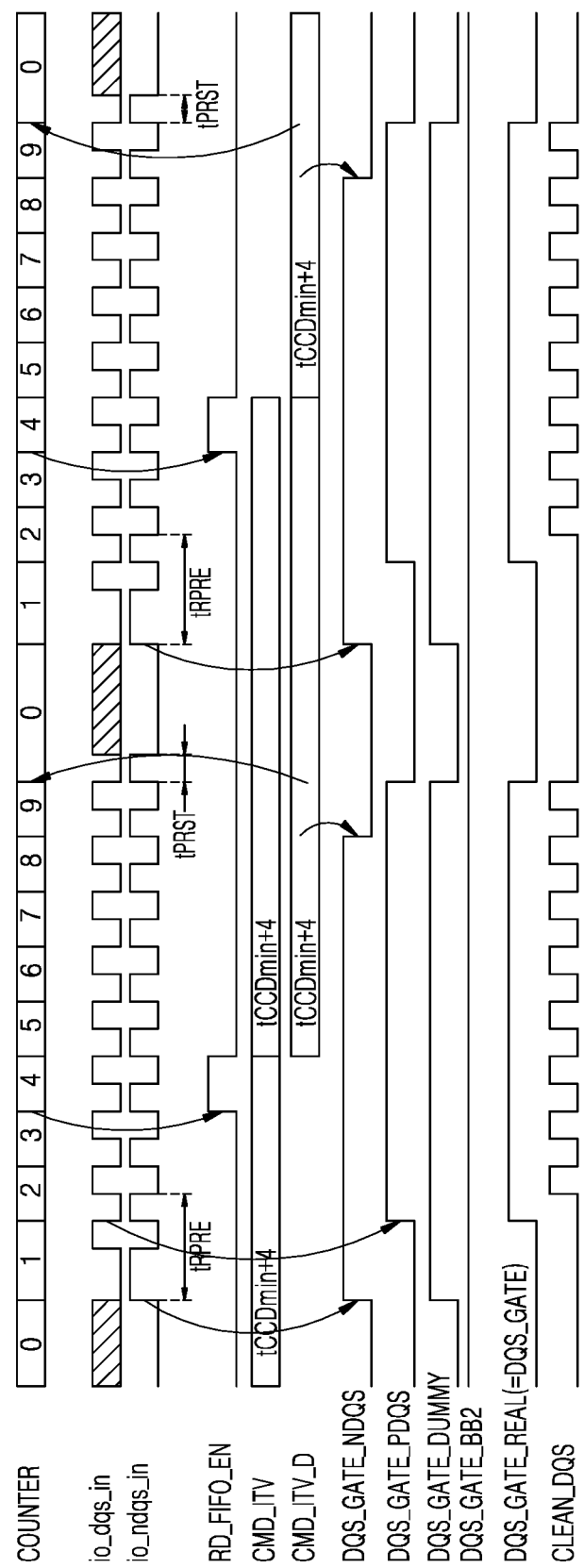
FIGS. 9 to 11 are waveform diagrams showing an operation of a memory controller according to example embodiments.
Figure 10:
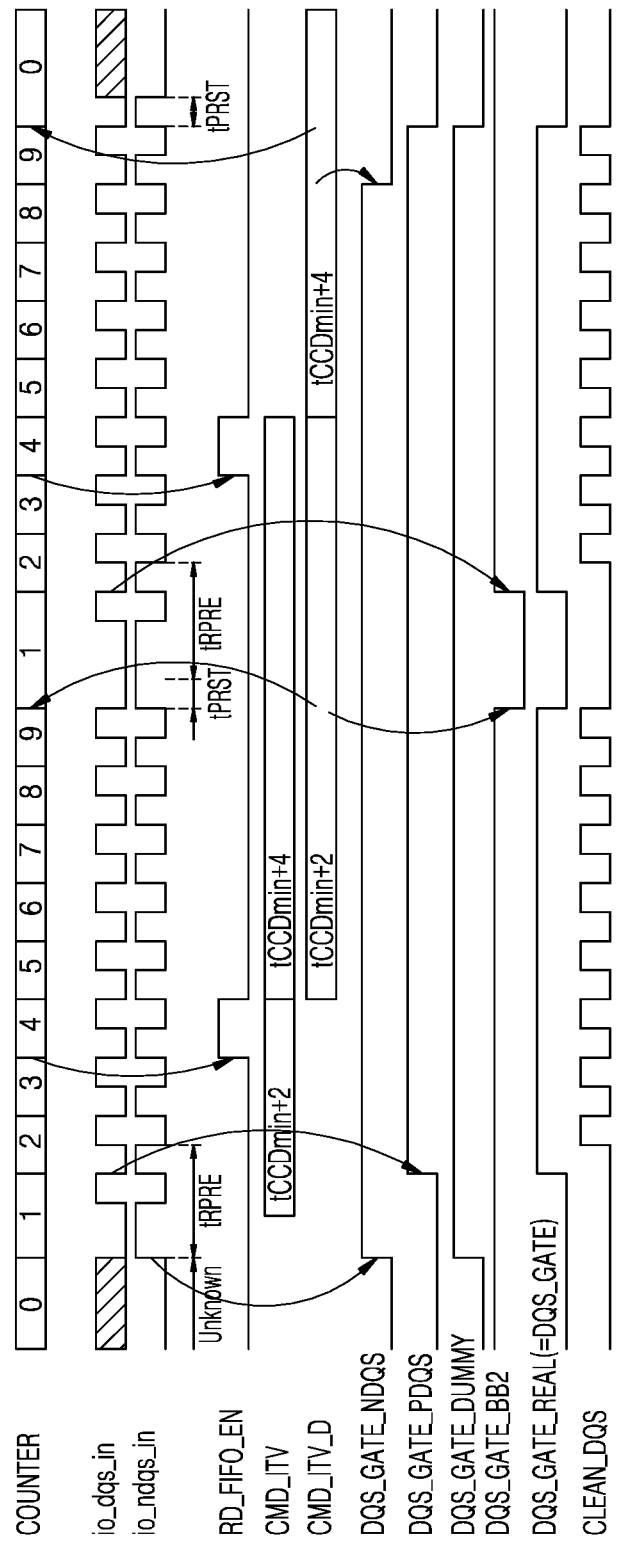
Figure 11:
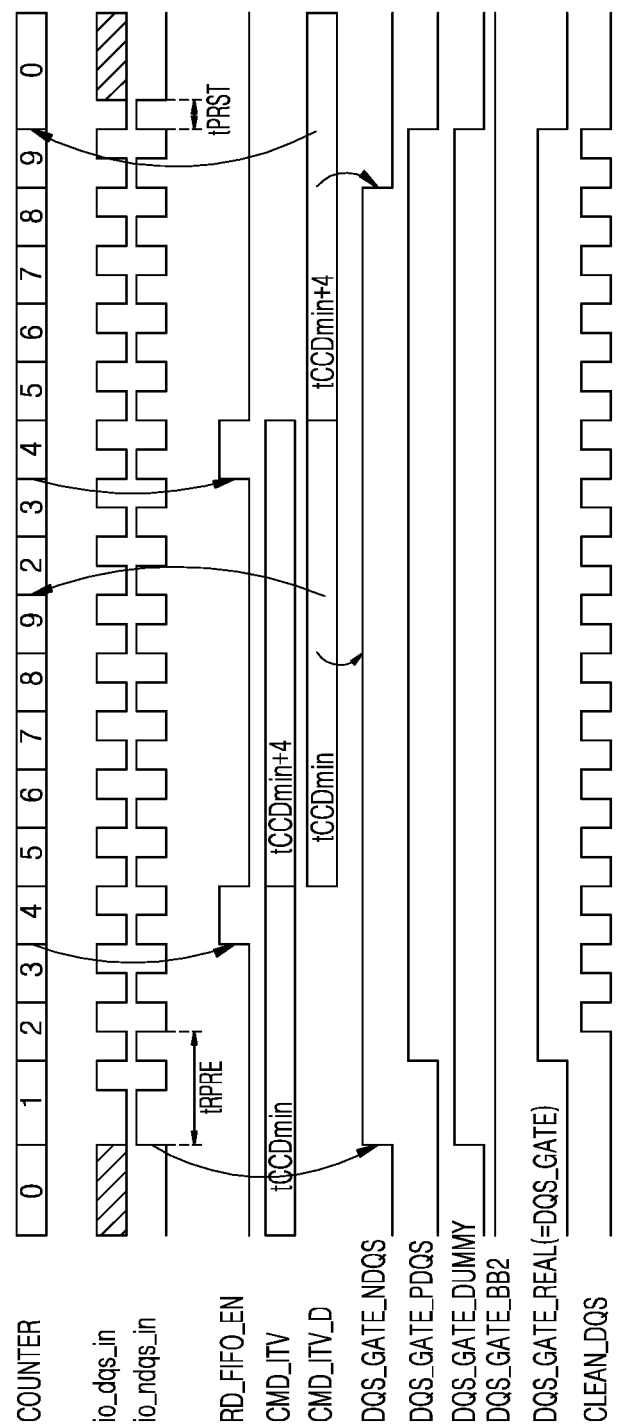

FIGS. 9 to 11 are waveform diagrams showing an operation of a memory controller according to example embodiments.

FIG. 9 shows an example in which the interval of the 16 BL read commands RD CMD corresponds to "tCCDmin+4". That is, since the interval of the consecutive read commands RD CMD corresponds to "tCCDmin+4", the idle period and the preamble period may exist between the data readout periods. As another example, the waveform diagram shown in FIG. 9 may be applied even though the interval of the read commands RD CMD is greater than "tCCDmin+4".

Referring to FIGS. 6 and 9, a counter (not shown) of the gate signal generator 340 may perform the counting operation in response to the second detection signal io_ndqs_in. As an example, the counter (not shown) of the gate signal generator 340 may perform the counting operation in response to the rising edge of the second detection signal io_ndqs_in. In addition, according to an embodiment, the gate signal generator 340 may receive the interval detection result CMD_ITV readout from the FIFO 360, and the interval detection result CMD_ITV may be provided to the gate signal generator 340 after being delayed. That is, the gate signal generator 340 may receive the delayed interval detection result CMD_ITV D. As an example, the readout enable signal RD_FIFO_EN may be activated at an arbitrary count value before the counted value reaches 9, and as shown in FIG. 9, the readout enable signal RD_FIFO_EN may be activated when the counter counts 4. The delayed interval detection result CMD_ITV D may correspond to a signal obtained by capturing the interval detection result CMD_ITV at the rising edge of the second detection signal io_ndqs_in.

As an example, since the burst length BL of the read command RD CMD corresponds to 16, the counted value may be initialized to a predetermined value after the counter counts 9. The initializing operation may be performed in consideration of the interval of the read command RD CMD. As an example, in a case where the delayed interval detection result CMD_ITV D corresponds to "tCCDmin+4" or more when the counter counts 9, the counter may change a next count result to 0. Then, as in the case of the read command RD CMD, when the preamble period tRPRE starts after the idle period, the second detection signal io_ndqs_in is transitioned to the logic high level again, and the counting operation may be performed from 1 to 9 in response to the second detection signal io_ndqs_in.

The first internal signal DQS_GATE_NDQS may transition to the logic high level, and after 16 burst readouts, the first internal signal DQS_GATE_NDQS may transition to the logic low level. In addition, the first internal signal DQS_GATE_NDQS may transition to the logic high level again at a start timing of the preamble period tRPRE. As described above, the second internal signal DQS_GATE_PDQS may be generated by capturing the first internal signal DQS_GATE_NDQS in response to the first detection signal io_dqs_in, and the second internal signal DQS_GATE_PDQS may be generated as the gate signal DQS_GATE since the preamble period tRPRE is defined between the memory controller 300 and the memory device (not shown). In this case, as shown in FIG. 9, a period with the logic low level is defined in the first internal signal DQS_GATE_NDQS, and thus the second internal signal DQS_GATE_PDQS and the gate signal DQS_GATE may have a period with the logic low level. That is, the gate signal DQS_GATE may be inactivated during the idle period and a period where a dummy toggle is generated in the preamble period tRPRE, and thus a deterioration in data reception characteristics, which is caused by the dummy toggle, may be prevented from occurring.

FIG. 10 shows an example in which a present interval of the 16 BL read commands RD CMD corresponds to "tCCDmin+2" and a next interval of the 16 BL read commands RD CMD corresponds to "tCCDmin+4". That is, since the interval of the present read command RD CMD and the interval of the next read command RD CMD correspond to "tCCDmin+2", the idle period does not exist right before the data readout period based on the next read command RD CMD, but the preamble period tRPRE and the postamble period tPRST may exist right before the data readout period.

Referring to FIGS. 6 and 10, as the counter counts 4, the readout enable signal RD_FIFO_EN may be activated, and the delayed interval detection result CMD_ITV D may be determined to correspond to "tCCDmin+2". In this case, since the idle period does not exist between the read commands RD CMD, a timing at which the idle period is changed to the preamble period tRPRE does not exist in association with the next read command RD CMD. Accordingly, different from the embodiment shown in FIG. 9, in a case where the delayed interval detection result CMD_ITV D corresponds to "tCCDmin+2", the first internal signal DQS_GATE_NDQS may be maintained in the logic high level without being transitioned to the logic low level when the counter counts 9. In addition, the counter may change the next count result to 1 after counting 9 based on the delayed interval detection result CMD_ITV D.

In this case, an additional internal signal DQS_GATE_BB2 may further be generated to prevent an influence caused by the dummy toggle from occurring during the preamble period tRPRE. As an example, the additional internal signal DQS_GATE_BB2 may be maintained in the logic high level, but the additional internal signal DQS_GATE_BB2 may transition to the logic low level in response to the falling edge of the first detection signal io_dqs_in in a case where the count value of the counter corresponds to 9 and the delayed interval detection result CMD_ITV D corresponds to "tCCDmin+2". In addition, the additional internal signal DQS_GATE_BB2 may transition to the logic high level in response to a falling edge of the toggling of the first detection signal io_dqs_in during the preamble period tRPRE after being maintained in the logic low level during a predetermined period. As an example, the additional internal signal DQS_GATE_BB2 may have the logic low level during at least a portion of the period including the preamble period tRPRE and the postamble period tPRST.

According to an embodiment, the fourth internal signal DQS_GATE_REAL may be generated using various internal signals in the gate signal generator 340. For instance, the fourth internal signal DQS_GATE_REAL may be generated by performing an AND operation the second internal signal DQS_GATE_PDQS with the additional internal signal DQS_GATE_BB2. In addition, since the preamble period tRPRE is defined between the memory controller 300 and the memory device, the fourth internal signal DQS_GATE_REAL may be used as the gate signal DQS_GATE instead of the third internal signal DQS_GATE_DUMMY. Since the fourth internal signal DQS_GATE_REAL has the above-mentioned logic low level period, the dummy toggle, which may be generated during the preamble period tRPRE before the next data readout period starts, may be effectively removed.

Meanwhile, since the interval between the next read command RD CMD and the read command RD CMD after the next read command RD CMD corresponds to "tCCDmin+4", waveforms of the various internal signals in response to the next read command RD CMD may be substantially the same as the waveforms described in FIG. 9. In addition, since a condition in which the additional internal signal DQS_GATE_BB2 is transitioned to the logic low level is not satisfied in FIG. 9, the additional internal signal DQS_GATE_BB2 may have the waveform to maintain the logic high level as shown in FIG. 9.

FIG. 11 shows an example in which a present interval of the 16 BL read commands RD CMD corresponds to "tCCDmin" and a next interval of the 16 BL read commands RD CMD corresponds to "tCCDmin+4". That is, since the interval of the present read command RD CMD and the interval of the next read command RD CMD correspond to "tCCDmin", the idle period, the preamble period, and the postamble period may not exist between the data readout periods.

Referring to FIGS. 6 and 11, as the counter counts 4, the readout enable signal RD_FIFO_EN may be activated, and the delayed interval detection result CMD_ITV D may be determined to correspond to "tCCDmin". In this case, the idle period, the preamble period, and the postamble period do not exist between the read commands RD CMD. The counting operation of the counter may be changed, as an example, the counter may change the next count result to 2 after counting 9 based on the delayed interval detection result CMD_ITV D corresponding to "tCCDmin". FIG. 11 further shows an example in which the interval detection result CMD_ITV of the read commands RD CMD corresponds to "tCCDmin+4", and in this case, the counter may change the next count result to 0 after the counter counts 9 as the embodiment described with reference to FIG. 9.

Meanwhile, as described in FIG. 10, when the counter counts 9, the first internal signal DQS_GATE_NDQS may be maintained in the logic high level without being transitioned to the logic low level. In addition, since the preamble period does not exist, the additional internal signal DQS_GATE_BB2 may be maintained in the logic high level without being transitioned to the logic low level to remove the dummy toggle during the preamble period. The fourth internal signal DQS_GATE_REAL may be generated by performing an AND operation on the second internal signal DQS_GATE_PDQS with the additional internal signal DQS_GATE_BB2, and the fourth internal signal DQS_GATE_REAL may be used as the gate signal DQS_GATE.

According to the embodiment shown in FIG. 11, since the idle period, the preamble period, and the postamble period do not exist between the data readout periods, the differential DQS signals DQS_t and DQS_c may be effectively continuously toggled, and the dummy toggle may not be generated between the data readout periods. Therefore, the gate signal DQS_GATE may be maintained in the logic high level over consecutive data readout periods as the embodiment shown in FIG. 11, and thus the memory controller 300 may stably receive the data even though the read commands RD CMD are consecutively generated at the interval of the minimum time tCCDmin. For example, when the interval of the present read command RD CMD and the interval of the next read command RD CMD is "tCCDmin", the gate signal DQS_GATE may be maintained in the logic high level between the data readout periods and thus, the gate signal DQS_GATE does not block the first detection signal io_dqs_in between the data readout periods.

Figure 12:
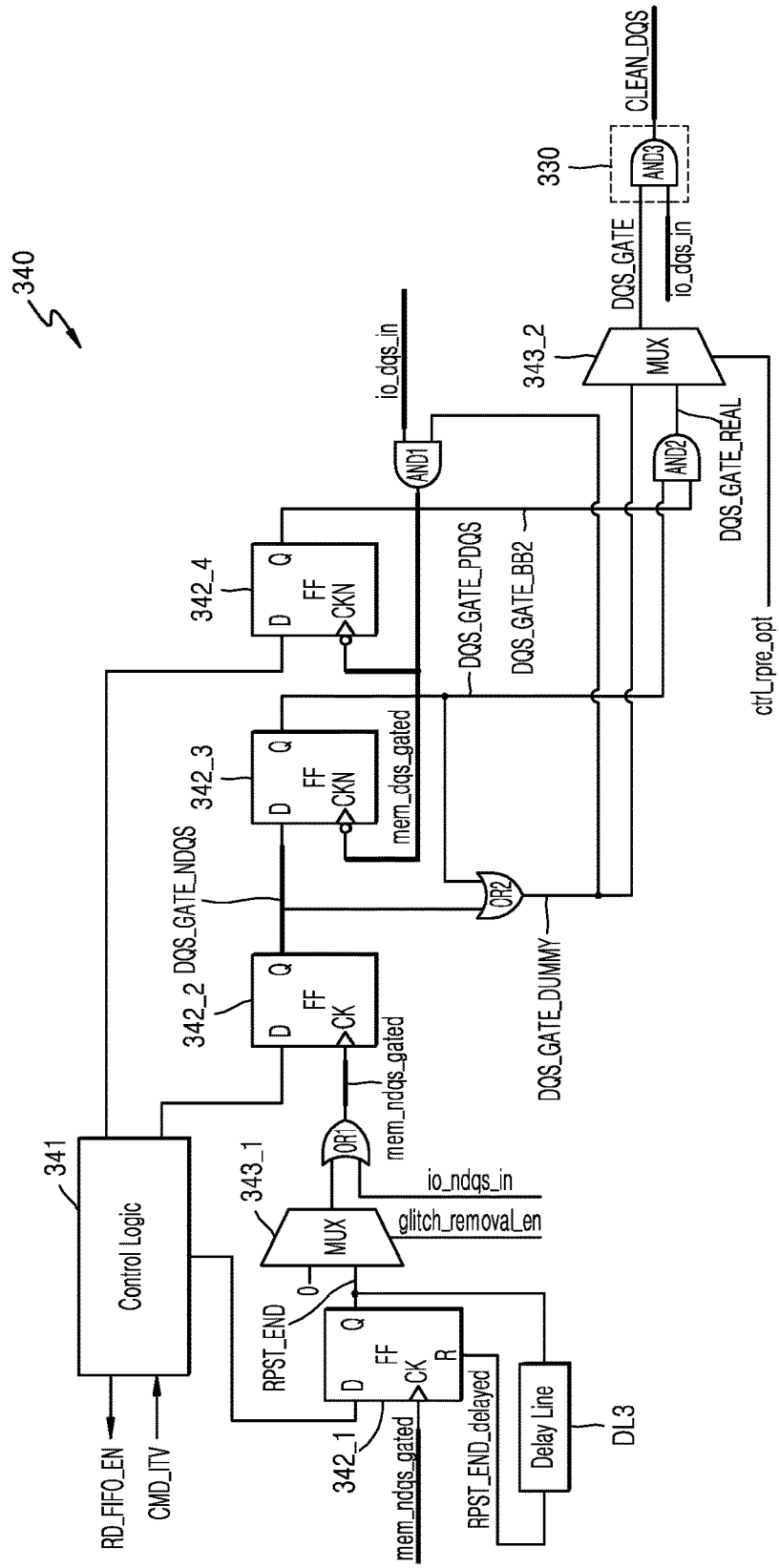
FIG. 12 is a circuit diagram showing a gate signal generator of FIG. 6 according to example embodiments.

FIG. 12 is a circuit diagram showing the gate signal generator 340 of FIG. 6 according to example embodiments.

Referring to FIG. 12, the gate signal generator 340 may include a plurality of logic circuits. As an example, the gate signal generator 340 may include a control logic 341, flip-flops 342_1 to 342_4, selectors 343_1 and 343_2, OR gates OR1 and OR2, and AND gates AND1 and AND2. Meanwhile, an AND gate AND3 shown in FIG. 12 may be a component included in the clean DQS signal generator 330 shown in FIG. 6.

The control logic 341 may include a counter and perform various control operations to generate the internal signals and the gate signal as described in the disclosed embodiments. As an example, the control logic 341 may provide a signal to a second flip-flop 342_2 generating the first internal signal DQS_GATE_NDQS, and the second flip-flop 342_2 may receive the second detection signal io_ndqs_in through its clock terminal CK. The second flip-flop 342_2 may receive and output the signal from the control logic 341 in response to the second detection signal io_ndqs_in to generate the first internal signal DQS_GATE_NDQS. According to an embodiment, the second flip-flop 342_2 may receive the second detection signal io_ndqs_in or a signal mem_ndqs_gated obtained by removing the glitch from the second detection signal io_ndqs_in. To this end, a first selector 343_1 may output a glitch control signal RPST_END in response to a glitch control enable signal glitch_removal_en, and a first OR gate OR1 may output the result of the OR operation on the glitch control signal RPST_END and the second detection signal io_ndqs_in to the second flip-flop 342_2.

In addition, the third flip-flop 342_3 may generate the second internal signal DQS_GATE_PDQS. As an example, the third flip-flop 342_3 may receive the output of the second flip-flop 342_2 through an input terminal thereof and selectively receive the first detection signal io_dqs_in or a signal mem_dqs gated output from the first AND gate AND1 through its clock terminal CKN. Accordingly, the third flip-flop 342_3 may generate the second internal signal DQS_GATE_PDQS obtained by capturing the first internal signal DQS_GATE_NDQS in response to an edge of the first detection signal io_dqs_in or the signal mem_dqs gated. FIG. 12 shows the use of the signal mem_dqs gated, and thus, the first AND gate AND1 outputting the signal mem_dqs gated is shown in FIG. 12.

Meanwhile, the fourth flip-flop 342_4 may generate the additional internal signal DQS_GATE_BB2. As an example, the fourth flip-flop 342_4 may receive a signal from the control logic 341 through an input terminal D thereof and receive the first detection signal io_dqs_in or the signal mem_dqs gated through a clock terminal CKN thereof. The signal having the waveform to remove the dummy toggle occurring during the above-mentioned preamble period is provided to the fourth flip-flop 342_4 through the input terminal D, and thus the additional internal signal DQS_GATE_BB2 may be generated.

A second OR gate OR2 may generate the third internal signal DQS_GATE_DUMMY by performing an OR operation on the first internal signal DQS_GATE_NDQS and the second internal signal DQS_GATE_PDQS, and a second AND gate AND2 may generate the fourth internal signal DQS_GATE_REAL by performing an AND operation on the second internal signal DQS_GATE_PDQS with the additional internal signal DQS_GATE_BB2. The second selector 343_2 may output the third internal signal DQS_GATE_DUMMY or the fourth internal signal DQS_GATE_REAL as the gate signal DQS_GATE in response to a control signal ctrl_rpre_opt indicating that whether toggling of the differential clock signals during the preamble period exists. In addition, a third AND gate AND3 may generate the clean DQS signal CLEAN_DQS by performing an AND operation on the gate signal DQS_GATE with the first detection signal io_dqs_in.

In example embodiments, the gate signal generator 340 may perform a logical process to remove the glitch occurring after the postamble period. As an example, the first flip-flop 342_1 may receive the signal from the control logic 341 through the input terminal D and receive the above-mentioned signal mem_ndqs_gated through the clock terminal CK. In addition, the output of the first flip-flop 342_1 may correspond to a glitch control signal RPST_END, and the output of the first flip-flop 342_1 may be provided to a reset terminal R of the first flip-flop 342_1 as a delayed glitch control signal RPST_END delayed through a delay line DL3. The delay line DL3 may perform a delay operation by a predetermined period (e.g., 1.5 tCK), and the first flip-flop 342_1 may output the glitch control signal RPST_END having the logic high level during the predetermined period.

Figure 13:
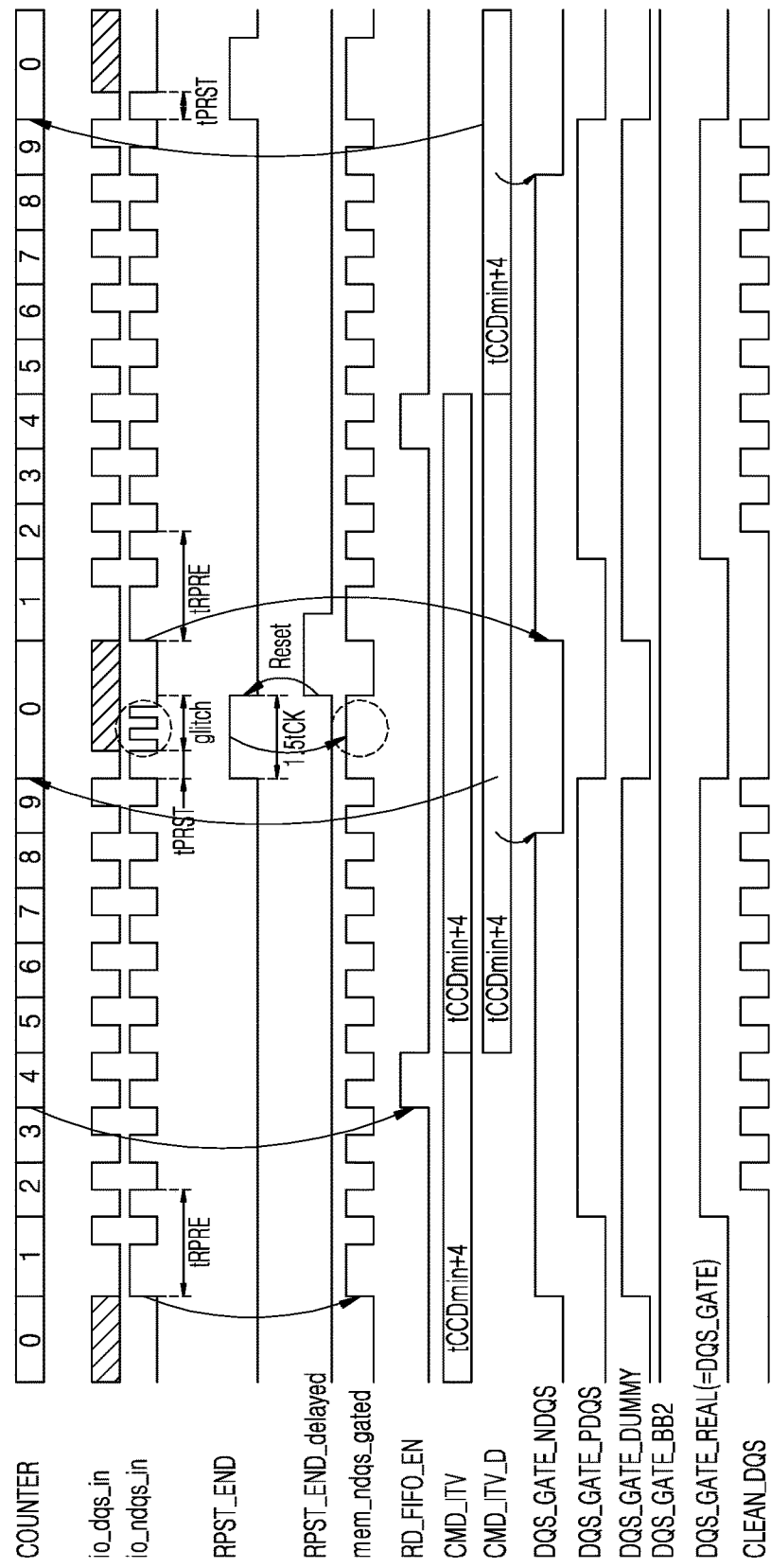
FIG. 13 is a waveform diagram showing an operation of a memory controller according to other example embodiments.

Hereinafter, the operation of removing the glitch will be described in detail with reference to FIG. 13. FIG. 13 is a waveform diagram showing an operation of the memory controller according to other example embodiments. In FIG. 13, the interval between the read commands RD CMD corresponds to "tCCDmin+4", and thus waveforms of various internal signals may be similarly generated as those shown in FIG. 9.

Referring to FIG. 13, the glitch occurring during a period (e.g., the idle period) other than the data readout period may be removed by the activated glitch control signal RPST_END. FIG. 13 shows the glitch occurring in the second detection signal io_ndqs_in during the idle period after the postamble period tPRST. In this case, the counter may count the glitches of the second detection signal io_ndqs_in. Thus, the first internal signal DQS_GATE_NDQS may transition to the logic high level, and after 16 burst readouts, the first internal signal DQS_GATE_NDQS may transition to the logic low level. In addition, the first internal signal DQS_GATE_NDQS may transition to the logic high level again at a time before the preamble period tRPRE starts according to the second detection signal io_ndqs_in including the glitch. Accordingly, the gate signal DQS_GATE from which the glitch is included may be generated.

According to an embodiment, the glitch control signal RPST_END may transition to the logic high level in synchronization with the second detection signal io_ndqs_in at the timing at which the postamble period tPRST starts, and the delayed glitch control signal RPST_END delayed that is delayed by the delay line DL3 shown in FIG. 12 by about 1.5 tCK may be generated. In one embodiment, the delayed glitch control signal RPST_END delayed may be delayed by an amount different from about 1.5 tCK. In addition, the glitch control signal RPST_END may transition to the logic low level at the timing, at which the delayed glitch control signal RPST_END delayed is transitioned to the logic high level, according to the operation of the first flip-flop 342_1. Accordingly, the glitch control signal RPST_END activated at the logic high level may be generated during the period in which the glitch occurs. Thus, the signal mem_ndqs_gated obtained by removing the glitch from the second detection signal io_ndqs_in may be generated. Then, the operation using the second detection signal io_ndqs_in may be performed with the signal mem_ndqs_gated, and thus the gate signal DQS_GATE from which the glitch is removed may be generated. In one embodiment, the counter may count the signal mem_ndqs_gated. For example, the first internal signal DQS_GATE_NDQS may transition to the logic high level, and after 16 burst readouts, the first internal signal DQS_GATE_NDQS may transition to the logic low level. In addition, the first internal signal DQS_GATE_NDQS may transition to the logic high level again at a starting time of the preamble period tRPRE according to the signal mem_ndqs_gated without the glitch, and thus, the gate signal DQS_GATE from which the glitch is removed may be generated.

Figure 14:
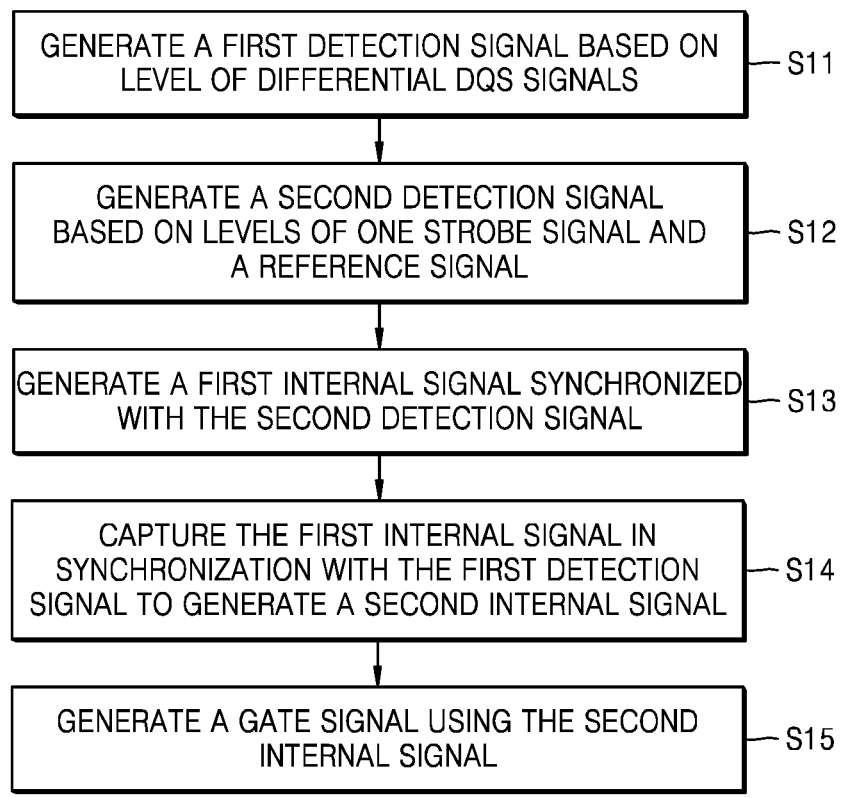
FIGS. 14 and 15 are flowcharts showing an operation of memory controllers according to example embodiments.
Figure 15:
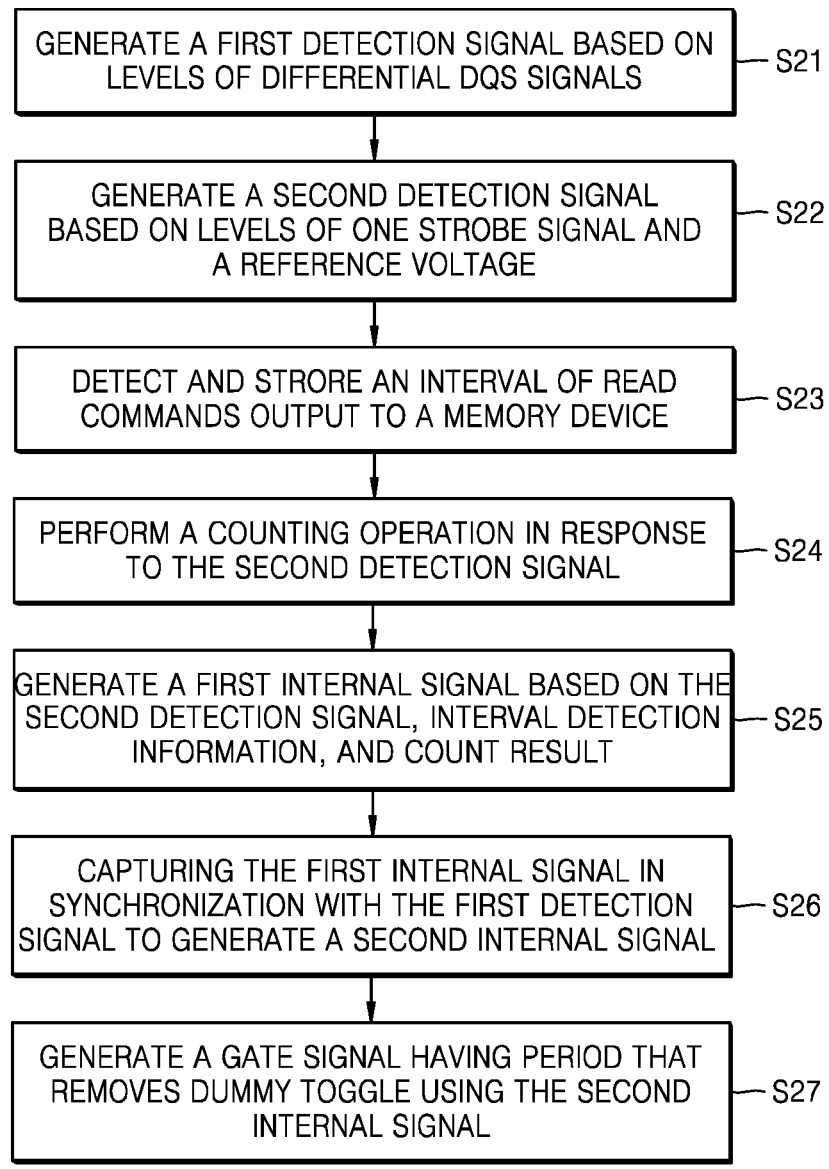

FIGS. 14 and 15 are flowcharts showing an operation of memory controllers according to example embodiments. FIGS. 14 and 15 show an operation of generating the gate signal using the differential DQS signal and the reference signal (e.g., a reference voltage).

Referring to FIG. 14, the data and the differential DQS signals may be provided to the memory controller from the memory device during the data readout operation. The idle period and the preamble period may exist before the data readout period actually starts, and the ODT circuit connected to the ground voltage may be applied to the input terminals of the receiver receiving the differential DQS signals.

The receiver receiving the differential DQS signals may generate the first detection signal in response to the levels of the differential DQS signals (S11). For instance, the first detection signal (e.g., io_dqs_in shown in FIG. 6) having the logic low level or the logic high level may be generated based on the difference in level between the first DQS signal and the second DQS signal. Similarly, the comparator included in the memory controller may receive one DQS signal (e.g., the second DQS signal) and the reference voltage having the predetermined level and generate the second detection signal (e.g., io_ndqs_in shown in FIG. 6) having the logic low level or the logic high level based on the difference in level between the second DQS signal and the reference voltage (S12).

During the idle period in which the ODT circuit is enabled, the signals having logic low level are input to two input terminals of the receiver receiving the differential DQS signal, and thus the first detection signal may have the tri-state. On the contrary, the reference voltage may have the intermediate level between the logic low level and the logic high level, and the second detection signal may have the logic low level in the idle period in which the ODT circuit is enabled.

Then, the preamble period having a length corresponding to a predetermined number of clocks may start, and the first DQS signal and the second DQS signal may be driven to have the differential characteristics in response to the start of the preamble period. For instance, the first DQS signal is driven at the logic low level and the second DQS signal is driven at the logic high level at the start timing of the preamble period. In this case, the second DQS signal may transition to the logic high level from the logic low level at the start timing of the preamble period.

The various internal signals may be generated using the first and second detections signals. The first internal signal (e.g., DQS_GATE_NDQS of FIG. 6) may be generated in response to or in synchronization with the second detection signal (S13). As an example, the first internal signal may be activated in synchronization with the rising edge of the second detection signal at the start timing of the preamble period and may have an active period corresponding to the burst length of the read command. In addition, the second internal signal (e.g., DQS_GATE_PDQS of FIG. 6) may be generated in synchronization with the first detection signal (S14), and as an example, the second internal signal may be generated by capturing the first internal signal in synchronization with the falling edge of the first detection signal in the preamble period. The gate signal may be generated using the first and second internal signals generated by the above-mentioned process (S15). As an example, the gate signal may be generated by using the second internal signal and one or more other internal signals generated in the memory controller according to the above-mentioned embodiments.

In the above-mentioned operation, the ODT circuit connected to the ground voltage is applied to the receiver receiving the differential DQS signals, but the memory controller may be operated identically or similarly to the above-mentioned embodiment even though the ODT (e.g., POD Term) circuit connected to the power source voltage is applied to the receiver. As an example, in a case where the POD Term is applied, signals having the logic high level are input to two input terminals of the receiver receiving the differential DQS signals during the idle period in which the ODT circuit is enabled. In this case, the first detection signal may have the tri-state, but the second detection signal may have the logic high level. In addition, when the preamble period starts, the first DQS signal and the second DQS signal may be driven to have the differential characteristics. For instance, the first DQS signal may have one level of the logic high level and the logic low level at the start timing of the preamble period, and the second DQS signal may have the other level of the logic high level and the logic low level at the start timing of the preamble period. Further, the differential DQS signals may be toggled at least once within the preamble period. In the case where the POD Term is applied, the first and second detection signals are generated based on the above-mentioned process using the differential DQS signals having the above-mentioned waveform characteristic, and the various internal signals are generated using the first and second detection signals, thereby generating the gate signal.

FIG. 15 shows a method of generating the gate signal based on the interval of the read commands.

Referring to FIG. 15, the receiver receiving the differential DQS signals may generate the first detection signal (e.g., io_dqs_in of FIG. 9) based on the levels of the differential DQS signals (S21), and the comparator included in the memory controller may generate the second detection signal (e.g., io_ndqs_in of FIG. 9) based on one DQS signal (e.g., the second DQS signal) and the reference voltage having the predetermined level (S22).

In addition, an interval detection circuit included in the memory controller may detect the interval of the read commands output to the memory device and feedback thereto and may store interval detection information in a storing circuit (e.g., FIFO) of the memory controller (S23). Further, the counter in the memory controller may perform the counting operation in response to the one detection signal (e.g., the second detection signal) (S24). For instance, the counter may perform the counting operation at the rising edge of the second detection signal to output the count value.

The various internal signals may be generated using the first and second detection signals, the interval detection information, and the counted result. As an example, the first internal signal (e.g., DQS_GATE_NDQS of FIG. 9) may be generated using the second detection signal, the interval detection information, and the count result (S25). The first internal signal may be activated in a case where the second detection signal is transitioned to the logic high level from the logic low level at the start timing of the preamble period. In addition, the first internal signal may be maintained in the active state or transitioned to the inactive state based on the interval detection information at a time point at which a predetermined count value based on the burst length of the read command is counted.

According to the above-described operation, the first internal signal having or not having the inactive period may be generated based on the interval detection information, and the second internal signal may be generated by capturing the first internal signal in synchronization with the first detection signal (S26). In addition, the gate signal may be generated using the second internal signal (S27), and the gate signal having the period needed to remove the dummy toggle may be generated since the inactive period exists in the second internal signal corresponding to the inactive period of the first internal signal.

Figure 16:
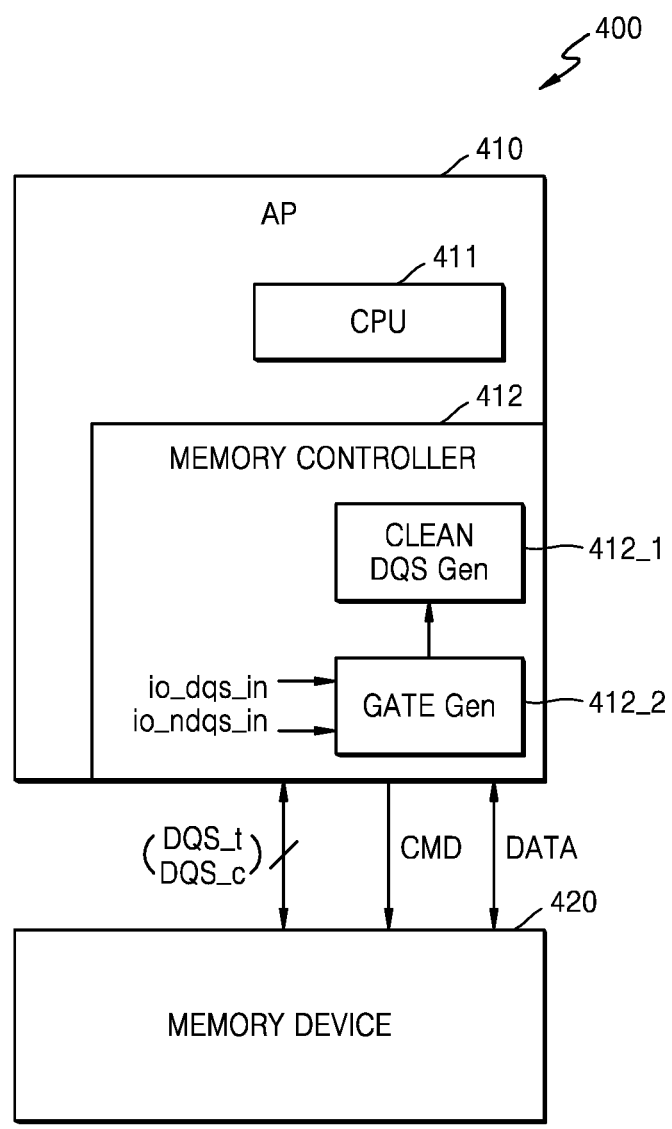
FIG. 16 is a block diagram showing a data processing system including an application processor according to certain embodiments.

FIG. 16 is a block diagram showing a data processing system 400 including an application processor according to certain embodiments.

The data processing system 400 may include an application processor 410 and a memory device 420. The application processor 410 may be implemented by a system-on-chip (SoC). The system-on-chip (SoC) includes a system bus (not shown) to which a protocol having a predetermined standard bus specification is applied and various intellectual properties (IPs) connected to the system bus. As the standard specification of the system bus, an advanced microcontroller bus architecture (AMBA) protocol of Advanced RISC Machine (ARM) may be applied. The bus type of AMBA protocol may include Advanced High-performance Bus (AHB), Advanced Peripheral Bus (APB), Advanced eXtensible Interface (AXI), AXI4, AXI Coherency Extension (ACE), and the like. In addition, other types of protocols, such as uNetwork of SONICs Inc., CoreConnect of IBM, Open Core Protocol of OCP-IP, etc., may be used.

The application processor 410 may include a processor (CPU) 411 and a memory controller 412. The memory controller 412 may perform the same or similar function as that of the memory controller described in the example embodiments, and thus the memory controller 412 may access the memory device 420 placed outside the application processor 410. In addition, the memory controller 412 may include a data strobe signal (DQS) receiver, and the DQS receiver may include a clean DQS signal generator 412_1 and a gate signal generator 412_2.

The memory controller 412 may transmit and receive data DATA to and from the memory device 420. As an example, the memory controller 412 may provide a command CMD require to readout the data to the memory device 420 and receive the data DATA and differential DQS signals DQS_t and DQS_c from the memory device 420. As described above, the memory controller 412 may generate the first detection signal io_dqs_in using the differential DQS signals DQS_t and DQS_c and generate the second detection signal io_ndqs_in using one DQS signal and the reference signal. The gate signal generator 412_2 may generate the gate signal using the first detection signal io_dqs_in and the second detection signal io_ndqs_in, and the clean DQS signal generator 412_1 may generate a clean DQS signal using the differential DQS signals DQS_t and DQS_c and the gate signal.

Figure 17:
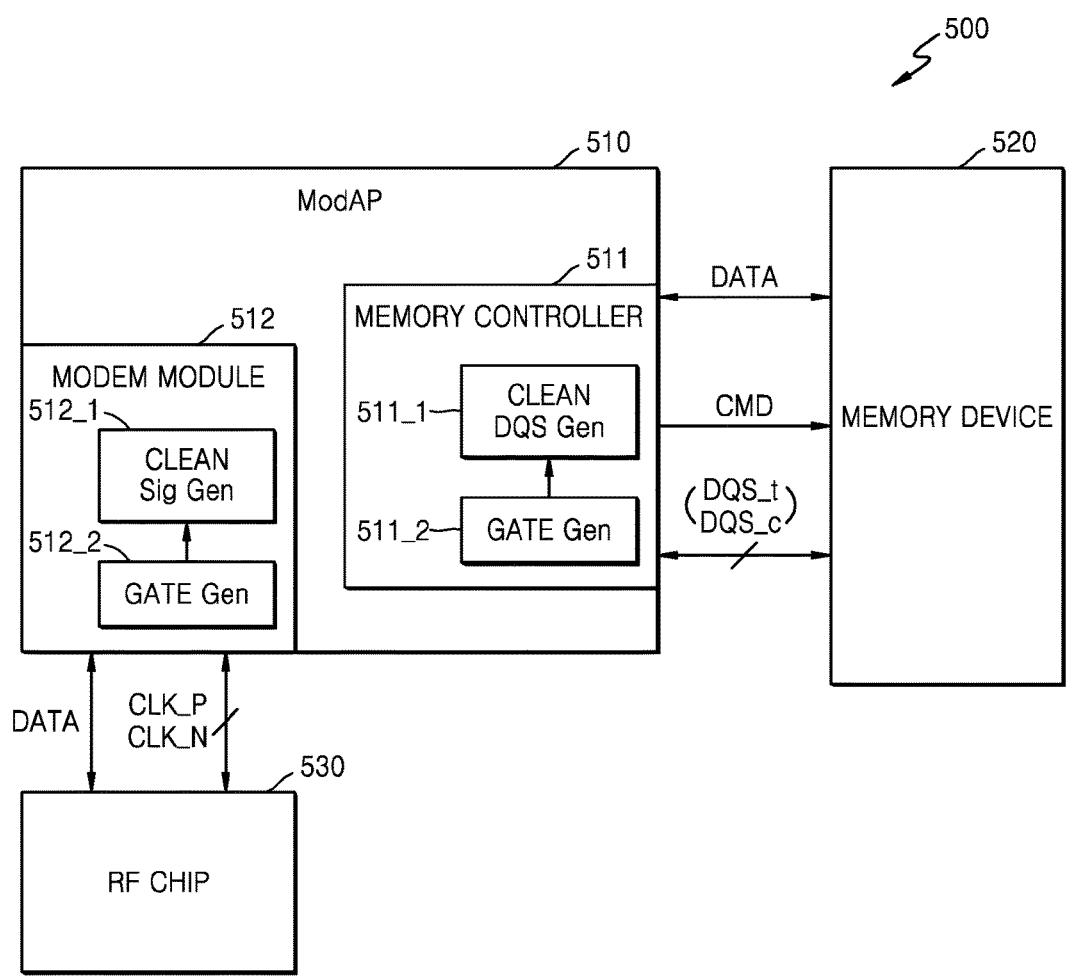
FIG. 17 is a block diagram showing a data processing system including an ModAP according to certain embodiments.

FIG. 17 is a block diagram showing a data processing system 500 including a ModAP 510 according to certain embodiments. A function of a modem chip is integrated in the application processor, and thus the application processor may be referred to as the "ModAP".

Referring to FIG. 17, the data processing system 500 including the ModAP 510 may further include a memory device 520 and a radio frequency (RF) chip 530, which communicate with the ModAP 510. The ModAP 510 may include a memory controller 511 communicating with the memory device 520 and further include a modem module 512 communicating with the RF chip 530.

As described in the example embodiments, the memory controller 511 may transmit and receive various signals to and from the memory device 520. As an example, the memory controller 511 may provide a command CMD to the memory device 520 and receive data DATA and differential DQS signals DQS_t and DQS_c from the memory device 520. As described in the previous embodiment, the memory controller 511 may include a clean DQS signal generator 511_1 and a gate signal generator 511_2.

In addition, the modem module 512 may transmit and receive various signals to and from the RF chip 530. For instance, the modem module 512 may receive the data DATA from the RF chip 530, and also the modem module 512 may receive differential clocks CLK_P and CLK_N from the RF chip 530 as clock signals used for various operations therein. The modem module 512 may use the differential clocks CLK_P and CLK_N to receive the data DATA, and signals used to actually latch the data DATA may be generated based on various processing operations using the differential clocks CLK_P and CLK_N as similar to the function of the memory controller described in the previous embodiments.

As an example, the modem module 512 may include a clean signal generator 512_1 and a gate signal generator 512_2 and generate a first detection signal using the differential clocks CLK_P and CLK_N and a second detection signal using one of the differential clocks CLK_P and CLK_N and a predetermined reference signal. The gate signal generator 512_2 may generate the gate signal using the first and second detection signals, and the clean signal generator 512_1 may generate signals used to actually latch the data DATA using the differential clocks CLK_P and CLK_N and the gate signal.

Figure 18:
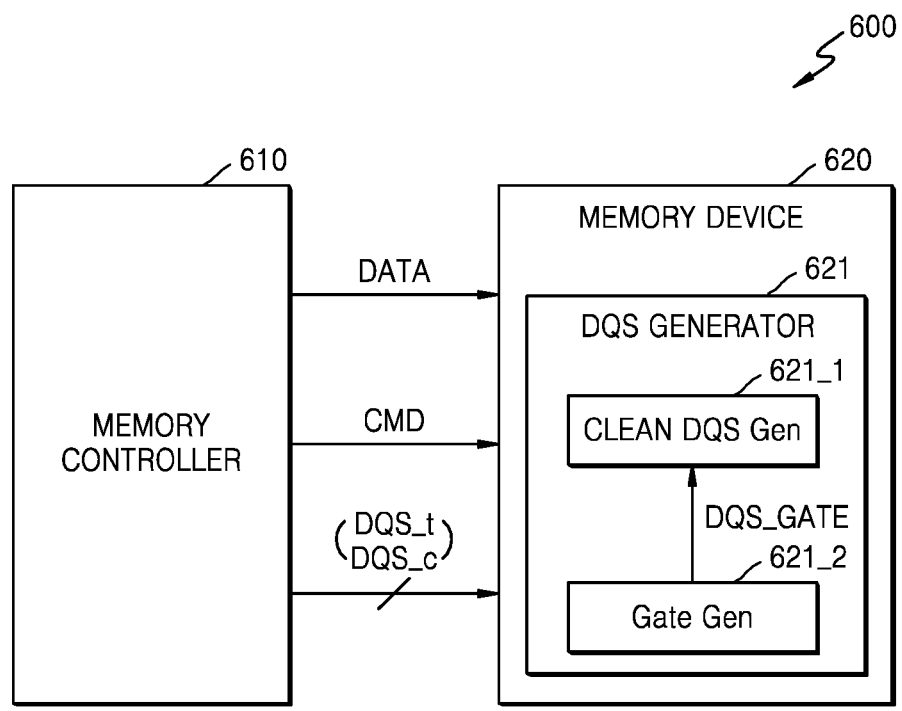
FIG. 18 is a block diagram showing a DQS receiver included in a memory device according to certain embodiments.

FIG. 18 is a block diagram showing the DQS receiver included in a memory device according to certain embodiments. As described above, the memory device may receive write data from the memory controller in the data write operation, and the differential DQS signals DQS_t and DQS_c may be provided to the memory device.

Referring to FIG. 18, a memory system 600 may include a memory controller 610 and a memory device 620, and the memory device 620 may include a DQS generator 621. The DQS generator 621 may be the DQS generator described above. In addition, the DQS receiver 621 may include a clean DQS signal generator 621_1 and a gate signal generator 621_2. The clean DQS signal generator 621_1 and the gate signal generator 621_2 shown in FIG. 18 may generate the gate signal and the clean DQS signal, which are described in the previous embodiments. As an example, the DQS generator 621 may generate the first and second detection signals using the differential DQS signals DQS_t and DQS_c and the reference voltage, generate one or more internal signals by processing the first and second detection signals, and generate the gate signal DQS_GATE by processing the internal signals.

Although not shown in FIG. 18, various ODT circuits may be applied to the DQS generator 621, and as an example, the ODT circuit connected to the ground voltage or the power source voltage may be applied to the reception of the differential DQS signal DQS_t and DQS_c.

While the present disclosure has been described in connection with what is presently considered to be practical example embodiments, it is to be understood by those who skilled in the art that the inventive concept is not limited to the disclosed embodiments, but, on the contrary, is intended to cover various modifications, substitutions, and equivalent arrangements included within the spirit and scope of the appended claims. The example embodiments may be constructed and/or utilized independently or in combination with any other embodiment contained herein. Therefore, the disclosed subject matter should not be limited to any single embodiment described herein, and the above-described embodiments are to be considered illustrative and not restrictive. Accordingly, the scope of the present inventive concept shall be determined only according to the attached claims.

What is claimed is:

1. A memory controller comprising:
    a strobe signal receiver including two inputs being terminated to a ground voltage respectively and configured to receive first and second strobe signals from a memory device as differential data strobe signals and output a first detection signal based on a level of each of the first and second strobe signals;
    a comparator configured to receive the second strobe signal and a reference voltage and compare a level of the second strobe signal with a level of the reference voltage to output a second detection signal based on a comparison result, wherein the comparator is configured to detect a transition of the second strobe signal from the ground voltage to a positive voltage larger than the reference voltage at a start time of a preamble period;
    a gate signal generator including a counter configured to count a predetermined number of toggling of the second detection signal, the gate signal generator configured to generate a gate signal masking a portion of a period corresponding to the differential data strobe signals based on the first detection signal, the second detection signal, and the counting result from the counter; and
    a clean strobe signal generator configured to receive the gate signal and the first detection signal from the strobe signal receiver and generate a clean strobe signal used to latch data provided from the memory device,
    wherein the gate signal generator is configured to generate the gate signal having a variable pulse width based on an existence of toggling of the differential data strobe signals in the preamble period,
    wherein the gate signal generator is configured to generate a plurality of internal signals for generating the gate signal, wherein the plurality of internal signals includes a first internal signal activated in response to the second detection signal, a second internal signal activated in response to the first detection signal and a third internal signal determined by performing an OR operation on the first and second internal signals, and wherein the gate signal generator is configured to generate any one of the second and third internal signals as the gate signal based on the existence of toggling of the differential data strobe signals in the preamble period.

2. The memory controller of claim 1, wherein the memory controller is configured to output sequentially first and second read commands, wherein an idle period and the preamble period exist between data readout periods corresponding to the first and second read commands, and wherein the differential data strobe signals are masked by the gate signal in at least a portion of the idle period and the preamble period.

3. A memory controller comprising:

a strobe signal receiver configured to receive first and second strobe signals from a memory device as differential data strobe signals and output a first detection signal based on a level of each of the first and second strobe signals;

a comparator configured to receive the second strobe signal and a reference voltage and compare a level of the second strobe signal with a level of the reference voltage to output a second detection signal based on a comparison result; and a gate signal generator configured to generate a gate signal masking a portion of a period corresponding to the differential data strobe signals based on the first detection signal and the second detection signal, wherein an idle period and a preamble period exist between data readout periods, and the differential data strobe signals are toggled at least once in the preamble period, wherein the gate signal generator is further configured to generate, a first internal signal (DQS_GATE_NDQS) activated in response to a start timing of the preamble period and a second internal signal (DQS_GATE_PDQS) activated in response to a toggling of the differential data strobe signals in the preamble period, and wherein the gate signal includes a third internal signal (DQS_GATE_REAL) having the same waveform as that of the second internal signal.

4. The memory controller of claim 3, further comprising a clean strobe signal generator configured to receive the gate signal and the first detection signal from the strobe signal receiver and generate a clean strobe signal used to latch data provided from the memory device.

5. The memory controller of claim 4, further comprising one or more flip-flops configured to latch the data provided from the memory device in response to the clean strobe signal.

6. The memory controller of claim 3, wherein an idle period further exists before the preamble period, and wherein the differential data strobe signals are masked by the gate signal in at least a portion of the idle period and the preamble period.

7. The memory controller of claim 6, wherein the second internal signal is activated at a falling edge of the first detection signal in the preamble period.

8. The memory controller of claim 3, wherein each of the first internal signal and the second internal signal includes an active period corresponding to a readout burst length, and wherein each of the first internal signal and the second internal signal is inactivated after the active period.

9. The memory controller of claim 8 further comprising a counter configured to count an edge of the first detection signal or the second detection signal when the preamble period starts, wherein the active period of the first internal signal is maintained until the counter counts a predetermined value.

10. The memory controller of claim 8, wherein the second internal signal is obtained by capturing the first internal signal in response to an edge of the first detection signal.

11. The memory controller of claim 3 further comprising an interval detection circuit configured to detect an interval between first and second read commands consecutively output from the memory controller and output an interval detection result, and wherein the gate signal generator is configured to generate the gate signal further based on the interval detection result.

12. The memory controller of claim 3, wherein the gate signal generator is configured to further generate a fourth internal signal by performing an OR operation on the first internal signal and the second internal signal, and wherein the gate signal is generated by using at least one of the first through the fourth internal signals.

13. A memory controller comprising:

a strobe signal receiver configured to receive first and second strobe signals as differential data strobe signals and output a first detection signal based on a level of each of the first and second strobe signals;

a comparator configured to compare a level of the second strobe signal with a level of a reference voltage to output a second detection signal;

an interval detection circuit configured to detect an interval between read commands provided to a memory device and output an interval detection result; and a gate signal generator including a counter configured to count a toggling of the first detection signal or the second detection signal, the gate signal generator being configured to generate a gate signal masking a portion of a period corresponding to the differential data strobe signals, based on the first detection signal, the second detection signal and the interval detection result, wherein an idle period and a preamble period are defined between data readout periods, and the differential data strobe signals are toggled at least once in the preamble period, and wherein a width of an inactive period of the gate signal for masking the differential data strobe signals in case that the interval has a relatively large value is greater than a width of the inactive period of the gate signal in case that the interval has a relatively small value.

14. The memory controller of claim 13, wherein a counted value is initialized after the counter counts a predetermined value set in connection with a readout burst length, and a next count result of the counter is variable based on the interval detection result.

15. The memory controller of claim 13, wherein the gate signal generator is configured to generate, a first internal signal (DQS_GATE_NDQS) activated in response to a start timing of the preamble period and a second internal signal (DQS_GATE_PDQS) activated in response to a toggling of the differential data strobe signals in the preamble period.

16. The memory controller of claim 15, wherein, when the idle period and the preamble period exist based on the interval detection result, each of the first internal signal and the second internal signal is inactivated after a period corresponding to a readout burst length.

17. The memory controller of claim 16, wherein, when the idle period and the preamble period exist based on the interval detection result, a third internal signal (DQS_GATE_REAL) having the same waveform as that of the second internal signal is output as the gate signal.

18. The memory controller of claim 17, wherein the differential data strobe signals are masked by the third internal signal in at least a portion of the idle period and the preamble period.

19. The memory controller of claim 15, wherein, when at least one of the idle period and the preamble period does not exist based on the interval detection result, an active state of each of the first internal signal and the second internal signal is maintained regardless of a readout burst length.

20. The memory controller of claim 19, wherein, when the idle period does not exist and the preamble period exists based on the interval detection result, a third internal signal (DQS_GATE_BB2) inactivated in at least a portion of the preamble period is generated, and wherein the gate signal is generated by performing an AND operation on the second internal signal and the third internal signal.

* * * * *